(12) United States Patent
Sato et al.

(10) Patent No.: US 11,374,384 B2
(45) Date of Patent: Jun. 28, 2022

(54) LIGHT-EMITTING DEVICE AND METHOD OF MANUFACTURING LIGHT-EMITTING DEVICE

(71) Applicant: Sony Corporation, Tokyo (JP)

(72) Inventors: Susumu Sato, Kanagawa (JP); Tatsushi Hamaguchi, Kanagawa (JP); Jugo Mitomo, Kanagawa (JP); Hiroshi Nakajima, Kanagawa (JP); Masamichi Ito, Miyagi (JP); Hidekazu Kawanishi, Tokyo (JP)

(73) Assignee: Sony Corporation, Tokyo (JP)

( * ) Notice: Subject to any disclaimer, the term of this patent is extended or adjusted under 35 U.S.C. 154(b) by 127 days.

(21) Appl. No.: 16/617,922

(22) PCT Filed: Apr. 16, 2018

(86) PCT No.: PCT/JP2018/015716
§ 371 (c)(1),
(2) Date: Nov. 27, 2019

(87) PCT Pub. No.: WO2018/221042
PCT Pub. Date: Dec. 6, 2018

(65) Prior Publication Data
US 2020/0112141 A1     Apr. 9, 2020

(30) Foreign Application Priority Data
May 31, 2017   (JP) .............................. JP2017-107830

(51) Int. Cl.
*H01S 5/183*     (2006.01)
(52) U.S. Cl.
CPC ...... *H01S 5/18375* (2013.01); *H01S 5/18305* (2013.01); *H01S 5/18327* (2013.01); *H01S 5/18388* (2013.01)

(58) Field of Classification Search
CPC ............. H01S 5/18305; H01S 5/18388; H01S 5/18327; H01S 5/18322;
(Continued)

(56) References Cited

U.S. PATENT DOCUMENTS

| | | | | |
|---|---|---|---|---|
| 4,935,939 A | * | 6/1990 | Liau | H01S 5/026 372/98 |
| 5,309,468 A | * | 5/1994 | Makiuchi | H01S 5/02253 372/50.23 |

(Continued)

FOREIGN PATENT DOCUMENTS

| | | | | |
|---|---|---|---|---|
| CN | 106848838 A | * | 6/2017 | ......... H01S 5/04253 |
| DE | 112017006413 T5 | * | 8/2019 | ......... H01S 5/18327 |

(Continued)

OTHER PUBLICATIONS

"Convex", American Heritage Dictionary of the English Language, Fifth Edition. Copyright 2016 by Houghton Mifflin Harcourt Publishing Company. Retrieved at www.thefreedictionary.com/convex on Sep. 10, 2021. (Year: 2016).*

(Continued)

*Primary Examiner* — Joshua King
(74) *Attorney, Agent, or Firm* — K&L Gates LLP

(57) ABSTRACT

A light-emitting device according to an embodiment of the present disclosure includes a laminate. The laminate includes an active layer, and a first semiconductor layer and a second semiconductor layer sandwiching the active layer. This light-emitting device further includes a current constriction layer having an opening and a vertical resonator including a first reflecting mirror having a concave-curved shape on the first semiconductor layer side and a second reflecting mirror on the second semiconductor side. The first reflecting mirror and the second reflecting mirror sandwich the laminate and the opening. This light-emitting device further includes an optically transparent substrate between (Continued)

the first reflecting mirror and the laminate. The optically transparent substrate has a first convex portion having a convex-curved shape and one or more second convex portions on a surface on the side opposite to the laminate. The first convex portion is in contact with the first reflecting mirror. The one or more second convex portions are provided around the first convex portion. The one or more second convex portions each have a height greater than or equal to a height of the first convex portion, and an end on the first reflecting mirror side has a convex-curved shape.

13 Claims, 11 Drawing Sheets

(58) Field of Classification Search
CPC . H01S 5/18308–18318; H01S 5/18341; H01S 5/18369–18372
See application file for complete search history.

(56) References Cited

U.S. PATENT DOCUMENTS

| | | | | |
|---|---|---|---|---|
| 5,341,390 | A * | 8/1994 | Yamada | H01S 5/18305 372/45.012 |
| 5,796,714 | A * | 8/1998 | Chino | H01S 5/04256 372/50.124 |
| 6,343,090 | B1 * | 1/2002 | Yoo | H01S 5/18388 372/96 |
| 6,661,829 | B2 | 12/2003 | Jeon | |
| 6,990,134 | B2 * | 1/2006 | Park | H01S 5/18388 372/50.11 |
| 10,290,996 | B1 * | 5/2019 | Mathai | H01S 5/18386 |
| 11,031,752 | B2 * | 6/2021 | Hamaguchi | H01S 5/18308 |
| 2001/0030319 | A1 * | 10/2001 | Sato | H01S 5/34 257/14 |
| 2002/0093024 | A1 * | 7/2002 | Lee | H01S 5/18388 257/98 |
| 2003/0122142 | A1 * | 7/2003 | Tatum | H01S 5/423 257/98 |
| 2007/0241354 | A1 * | 10/2007 | Tanaka | H01S 5/0422 257/98 |
| 2008/0031295 | A1 * | 2/2008 | Tanaka | H01L 33/382 372/44.01 |
| 2008/0247436 | A1 | 10/2008 | Carter et al. | |
| 2009/0129421 | A1 * | 5/2009 | Kitatani | H01S 5/22 372/50.23 |
| 2010/0203660 | A1 * | 8/2010 | Tanaka | H01S 5/0234 438/29 |
| 2011/0044363 | A1 * | 2/2011 | Uchida | B82Y 20/00 372/45.01 |
| 2012/0230361 | A1 * | 9/2012 | Adachi | H01S 5/18 372/45.01 |
| 2012/0248977 | A1 * | 10/2012 | Ootorii | H01L 25/167 313/524 |
| 2013/0272330 | A1 | 10/2013 | Joseph et al. | |
| 2015/0214695 | A1 * | 7/2015 | Adachi | H01S 5/18 372/20 |
| 2017/0063040 | A1 * | 3/2017 | Su | H01S 3/08059 |
| 2019/0386189 | A1 * | 12/2019 | Lee | H01L 33/08 |

FOREIGN PATENT DOCUMENTS

| | | | |
|---|---|---|---|
| JP | 03-263023 | 11/1991 | |
| JP | 05-055703 | 3/1993 | |
| JP | H05-075207 A | 3/1993 | |
| JP | 09-011791 | 1/1997 | |
| JP | H10-200200 A | 7/1998 | |
| JP | 10-335383 | 12/1998 | |
| JP | 11-191636 | 7/1999 | |
| JP | 2000022277 A * | 1/2000 | ............ H01L 33/20 |
| JP | 2002-237653 A | 8/2002 | |
| JP | 2003-017806 | 1/2003 | |
| JP | 2003-086877 | 3/2003 | |
| JP | 2005-303080 | 10/2005 | |
| JP | 2007-114454 | 5/2007 | |
| JP | 2008-244240 | 10/2008 | |
| JP | 2010-161180 A | 7/2010 | |
| JP | 2010147359 A * | 7/2010 | ......... G02B 6/4206 |
| JP | 2013-541854 | 11/2013 | |
| JP | 2019165198 A * | 9/2019 | ............ H01S 5/423 |
| WO | WO-2014175901 A1 * | 10/2014 | ......... H01S 5/18388 |
| WO | WO-2018083877 A1 * | 5/2018 | ............ H01S 5/183 |
| WO | WO-2018139877 A1 * | 8/2018 | ........ H01S 5/04257 |
| WO | WO-2018190030 A1 * | 10/2018 | ........ H01S 5/18308 |
| WO | WO-2019181757 A1 * | 9/2019 | ........ H01S 5/18305 |
| WO | WO-2020027296 A1 * | 2/2020 | ............ H01S 5/183 |
| WO | WO-2020247291 A1 * | 12/2020 | ........ H01S 5/18369 |

OTHER PUBLICATIONS

European Search Report dated May 20, 2020 in corresponding European Application No. 18810741.1.
High power and good beam quality of two-dimensional VCSEL array with integrated GaAs microlens array; Wang, et al., Nov. 8, 2010, vol. 18, No. 23, Optics Express 23900.

* cited by examiner

[ FIG. 1 ]
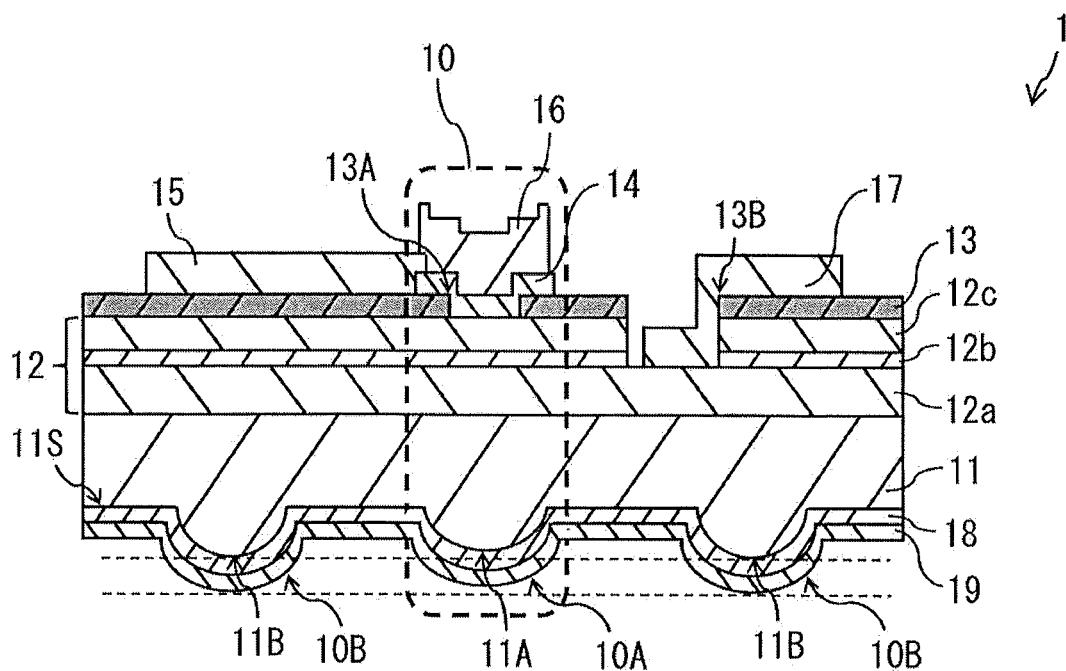
[ FIG. 2 ]
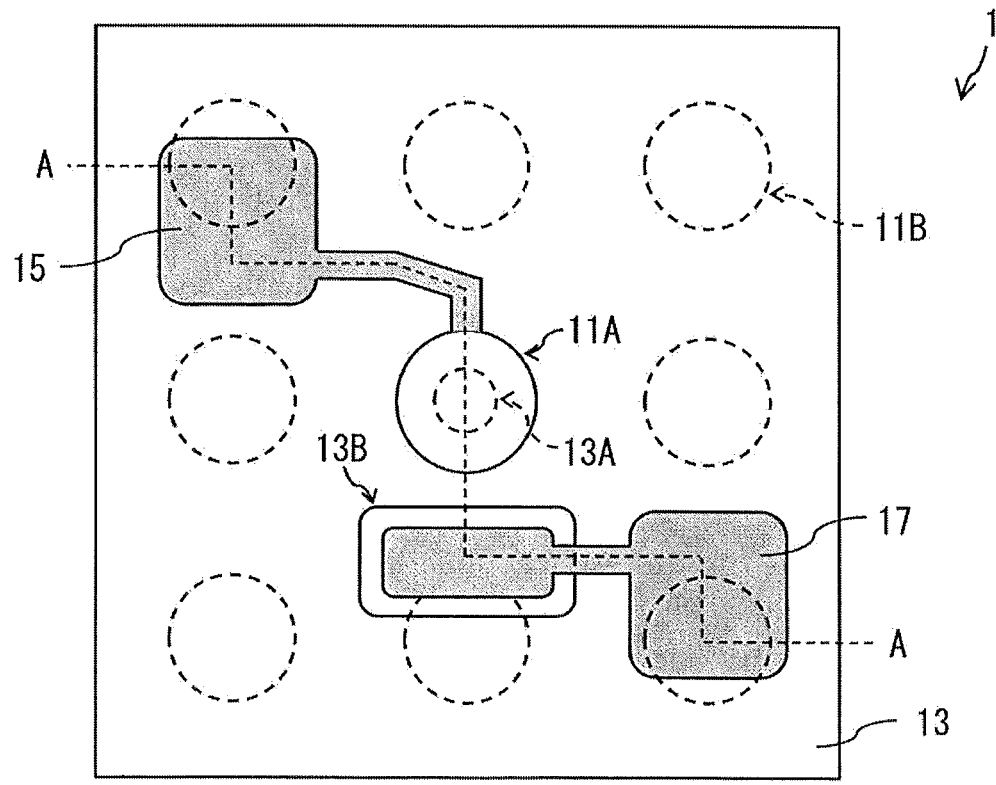

[ FIG. 3 ]
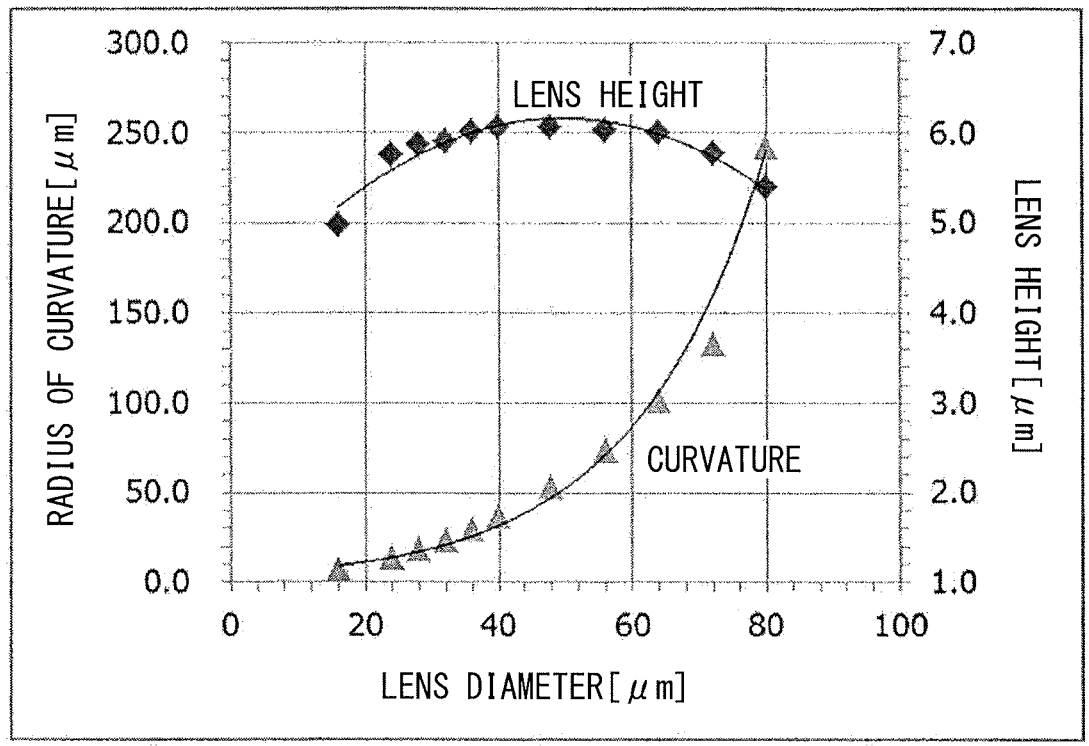
[ FIG. 4 ]
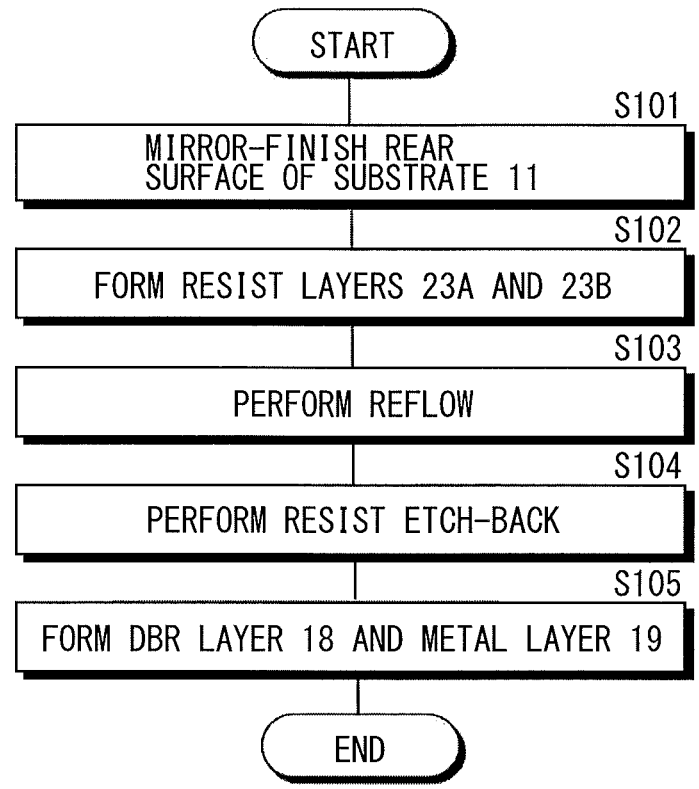

[ FIG. 5 ]
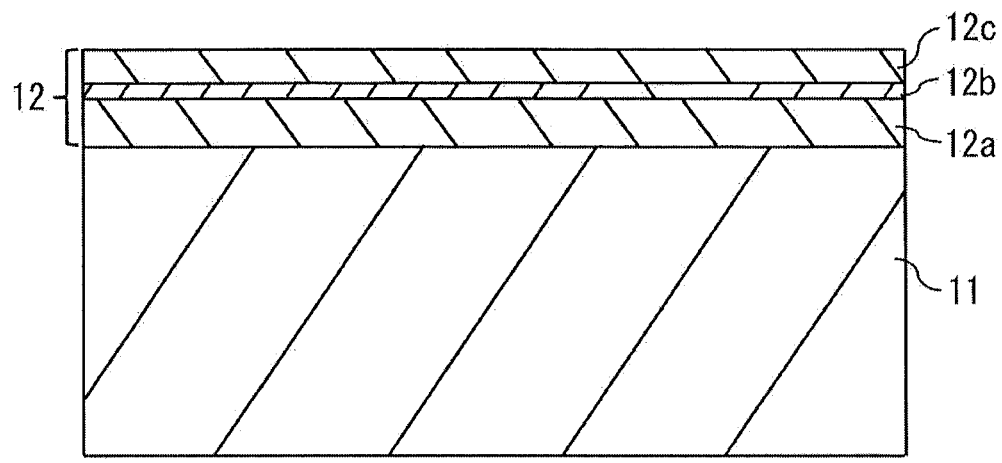
[ FIG. 6 ]
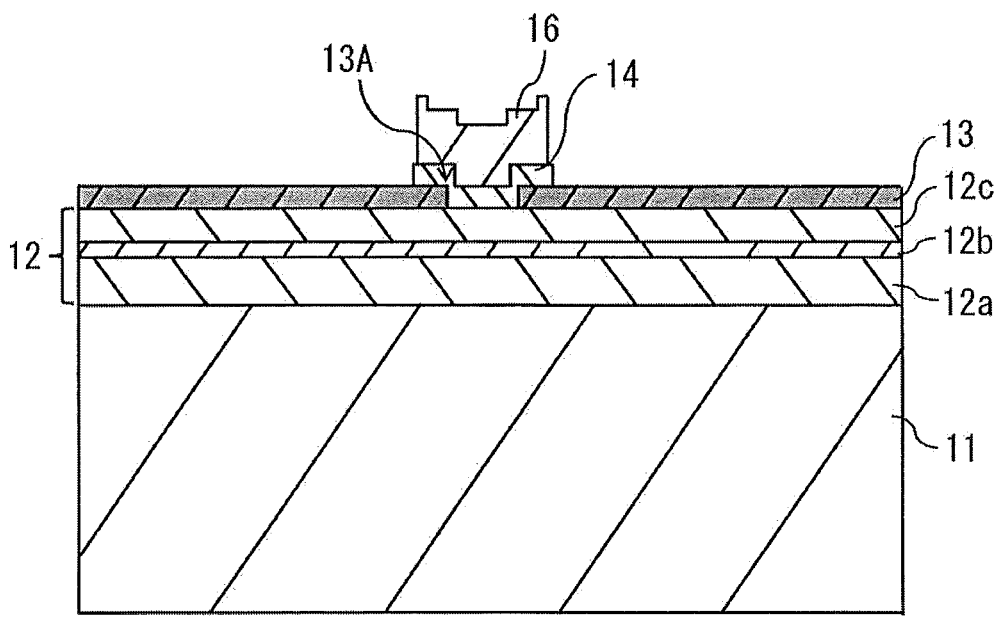

[ FIG. 7 ]
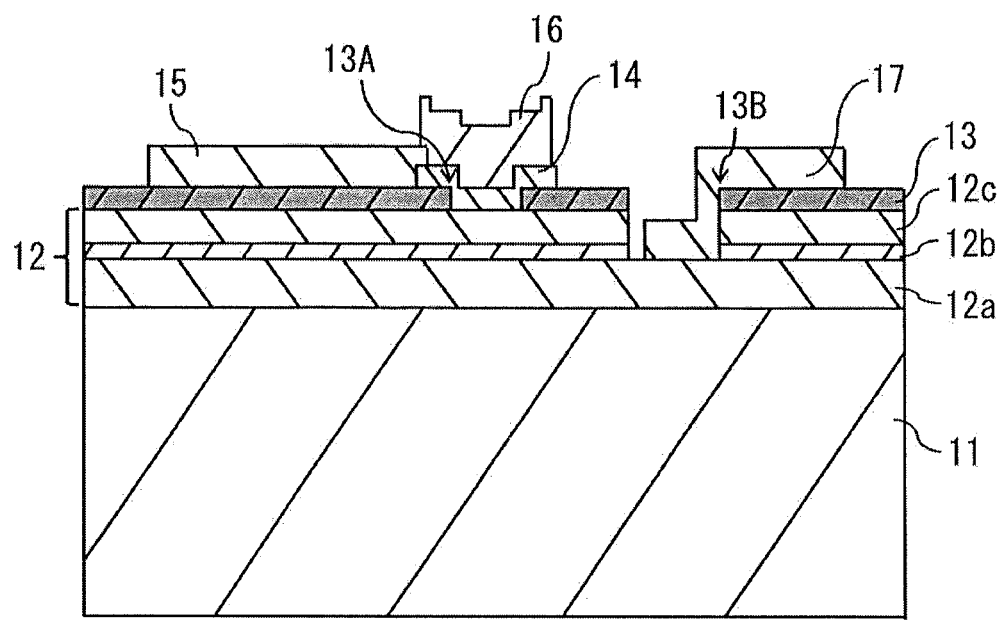
[ FIG. 8 ]
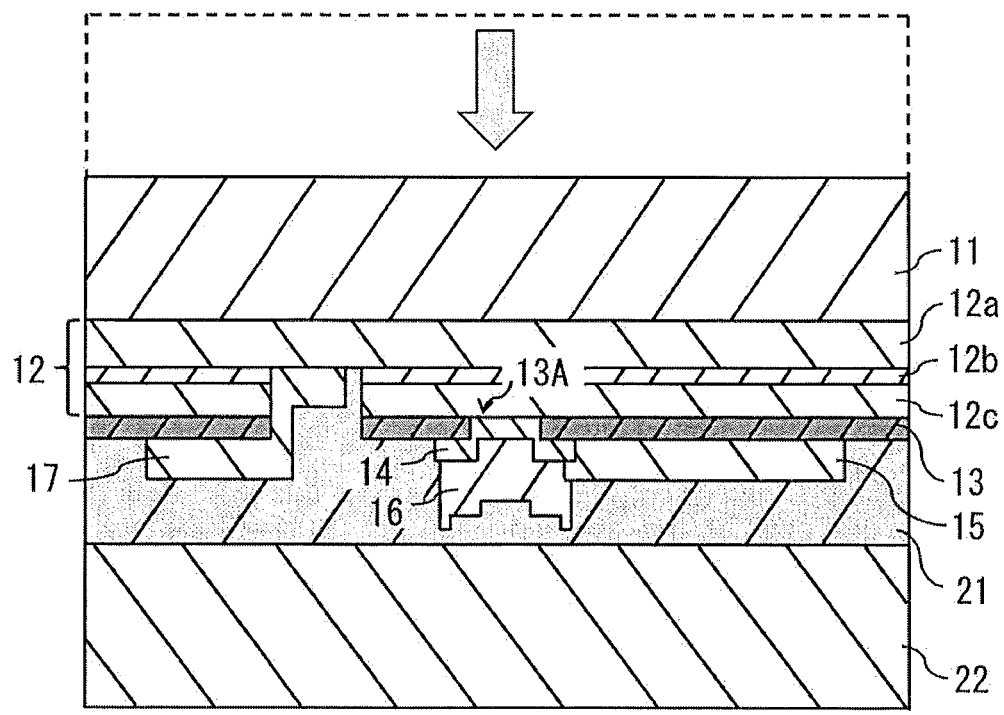

[ FIG. 9 ]
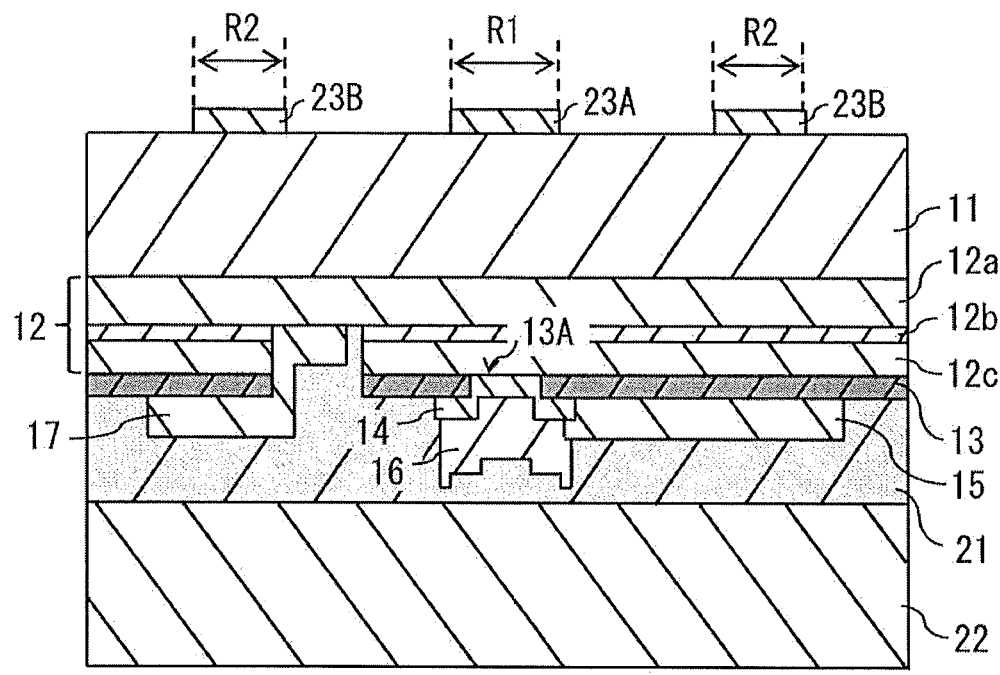
[ FIG. 10 ]
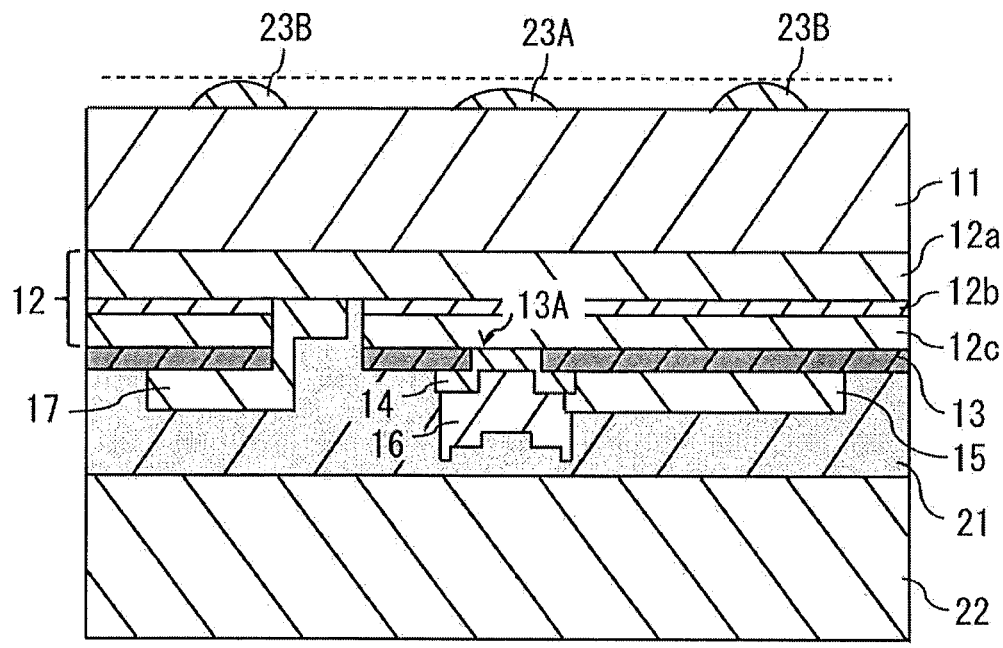

[ FIG. 11 ]
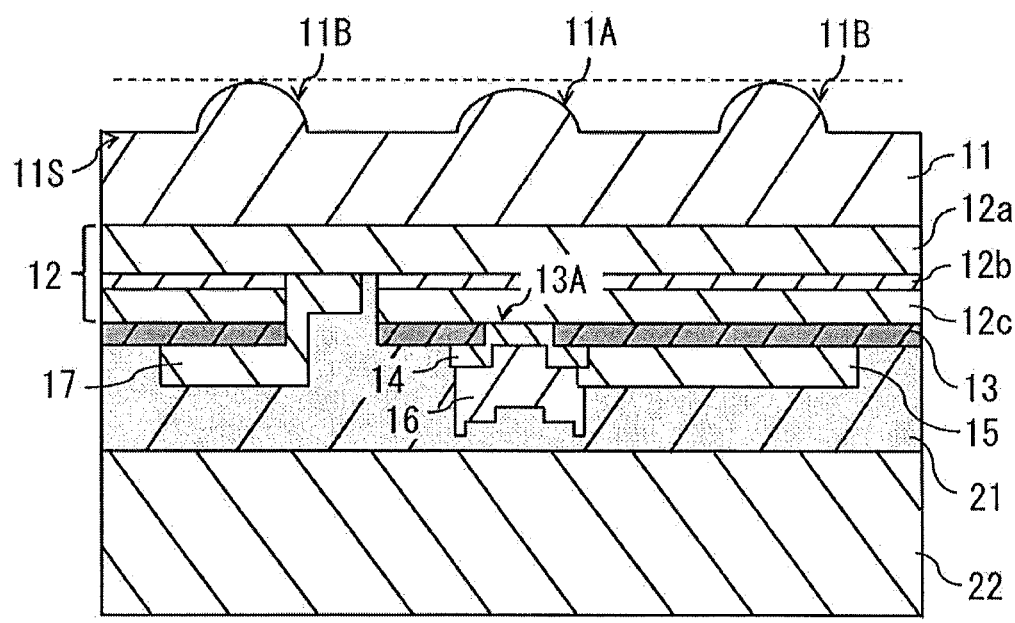
[ FIG. 12 ]
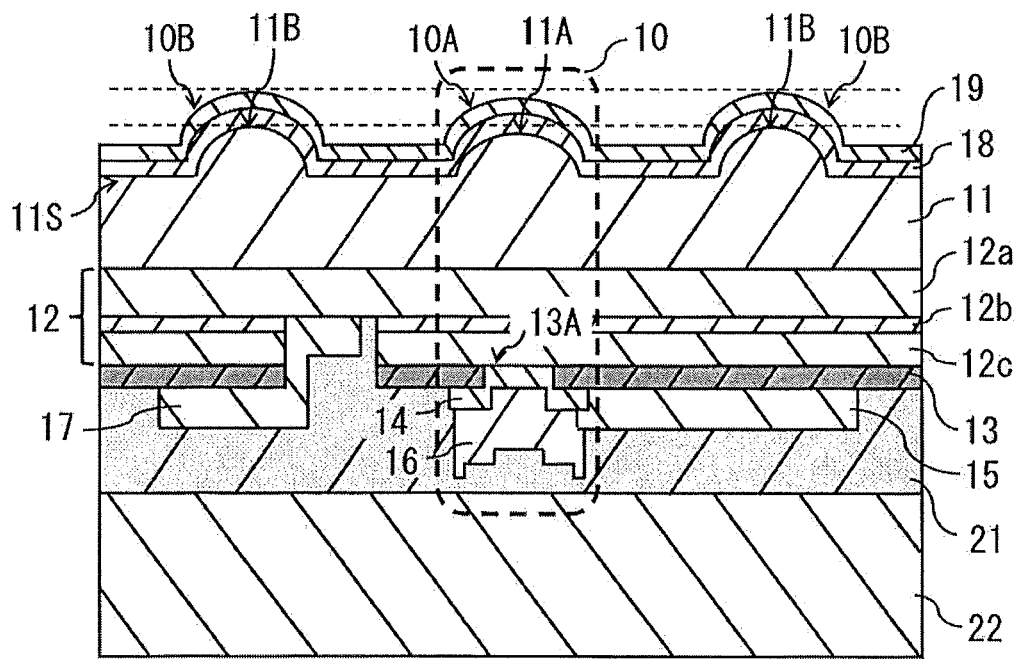

[ FIG. 13 ]
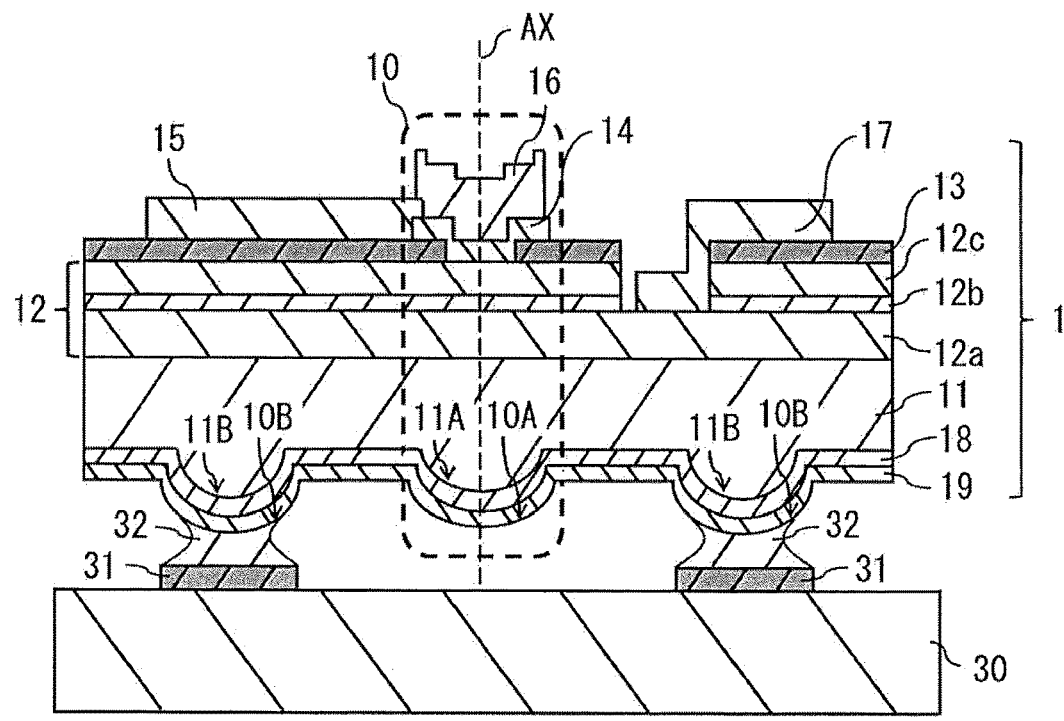
[ FIG. 14 ]
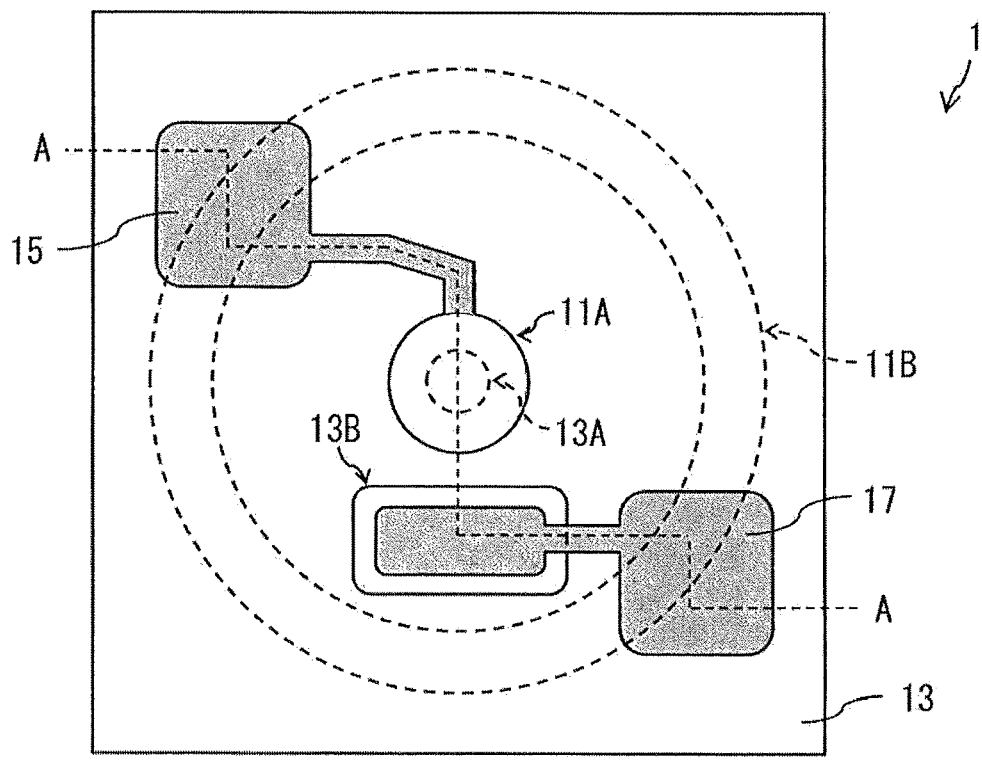

[ FIG. 15 ]
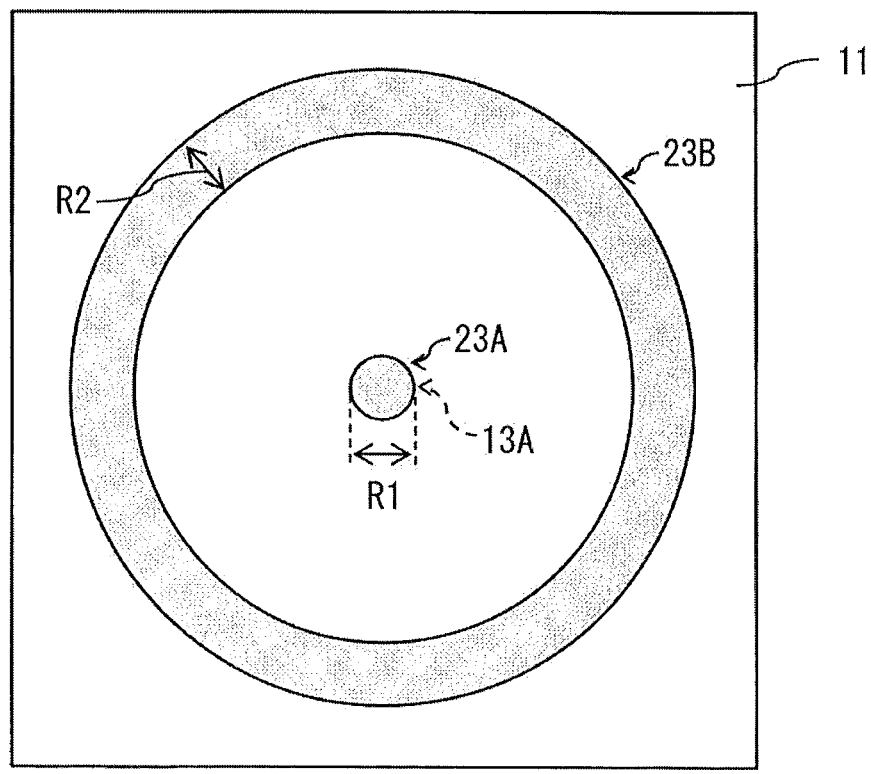
[ FIG. 16 ]
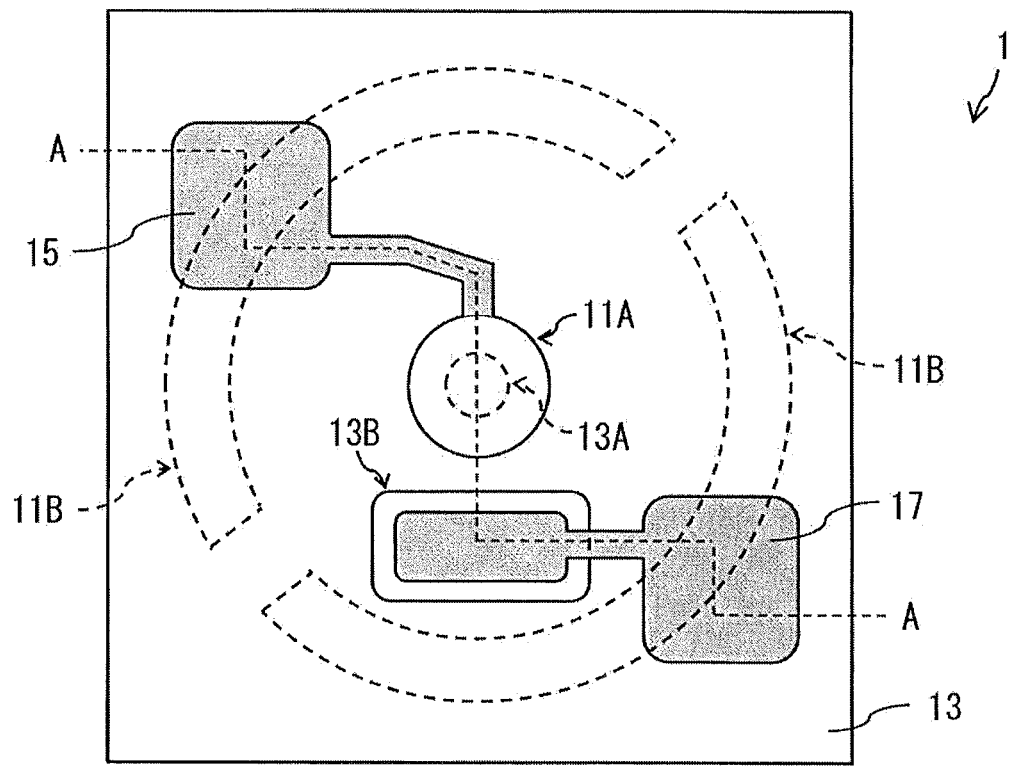

[ FIG. 17 ]
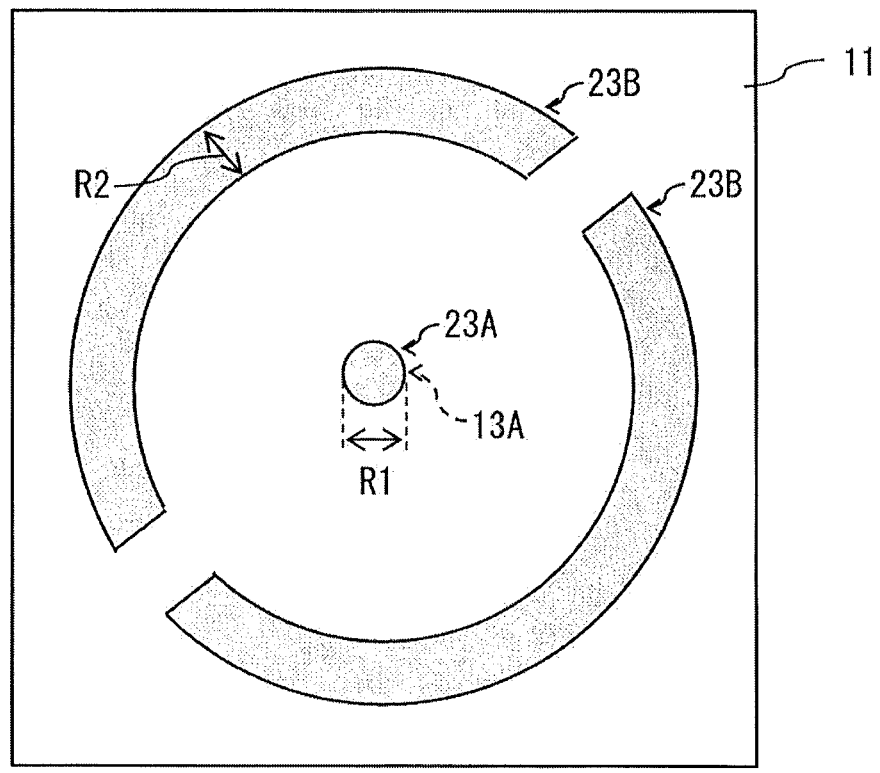
[ FIG. 18 ]
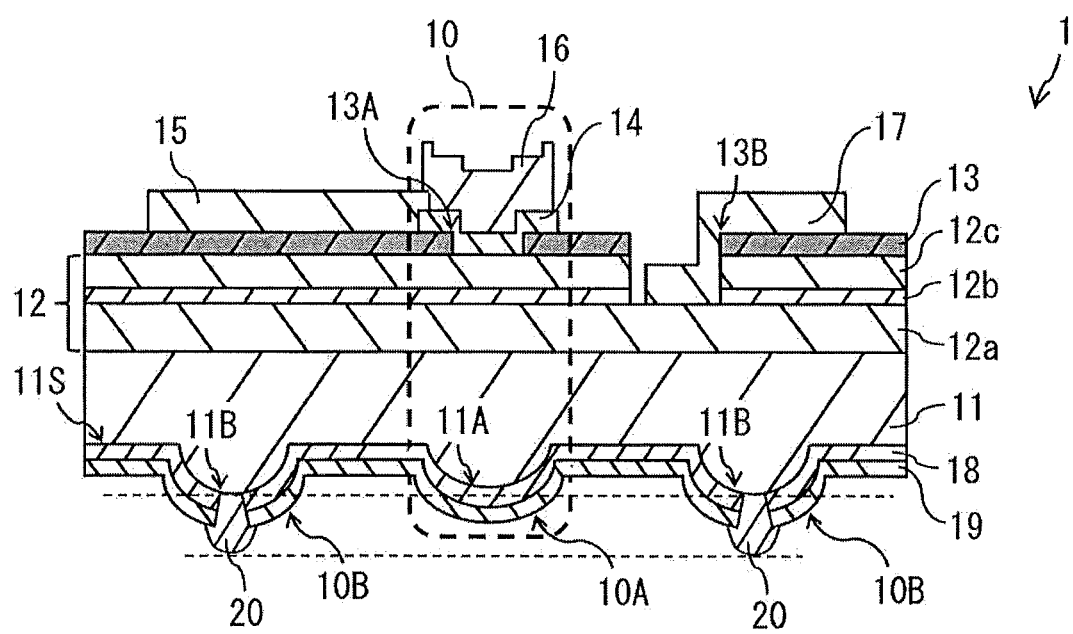

[ FIG. 19 ]
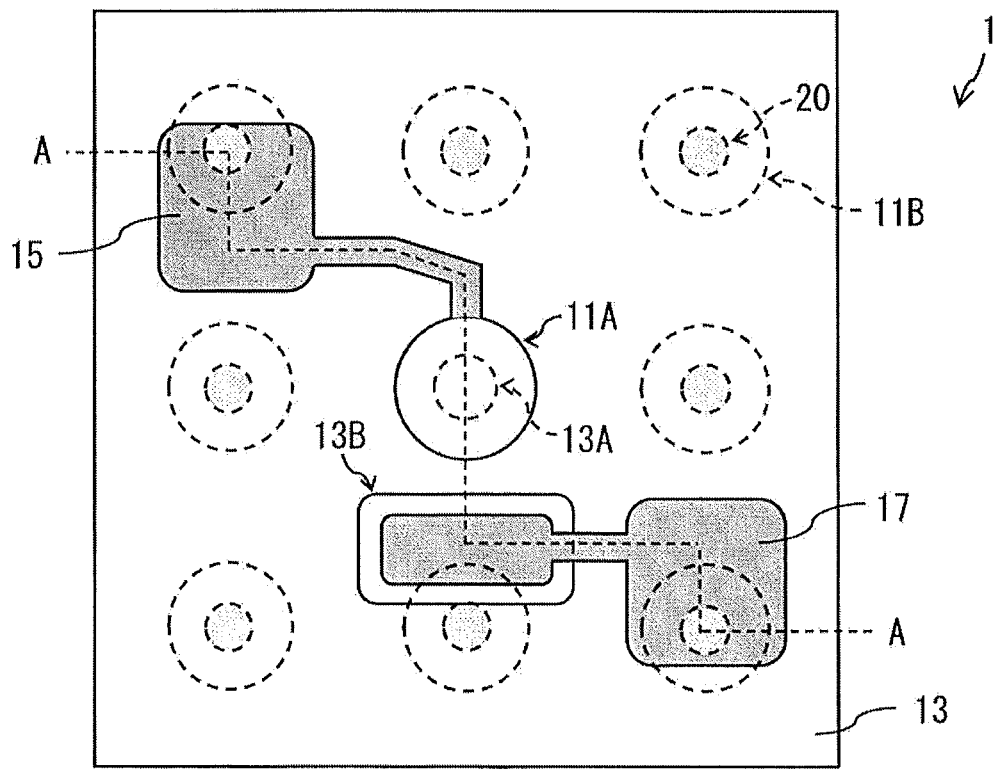
[ FIG. 20 ]
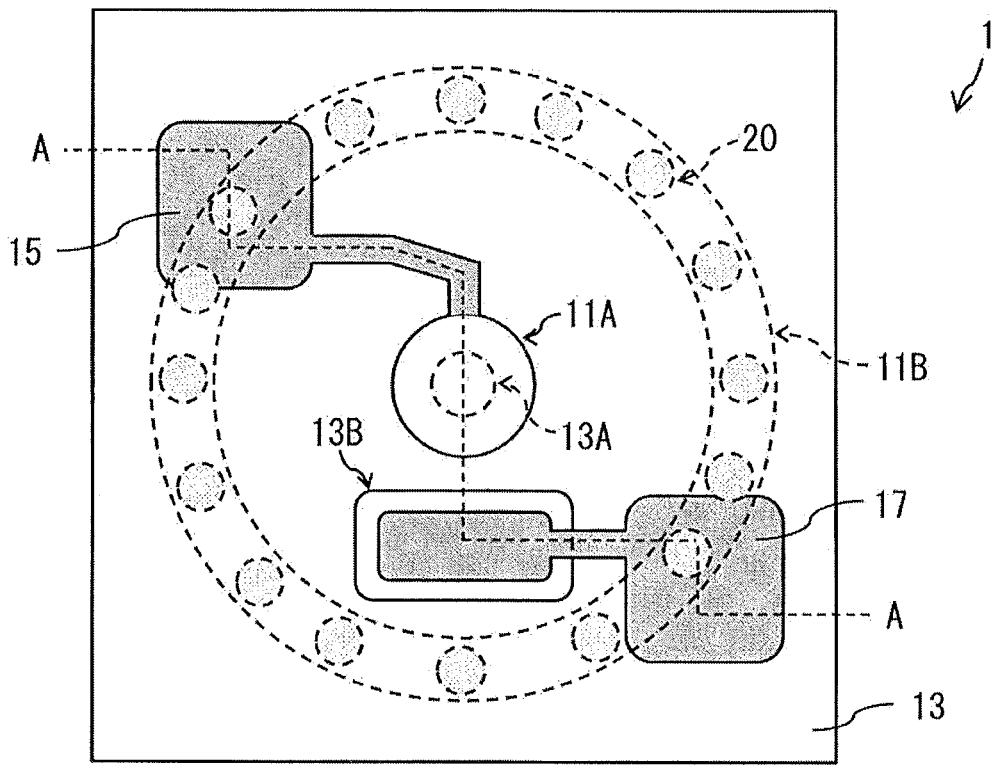

[ FIG. 21 ]
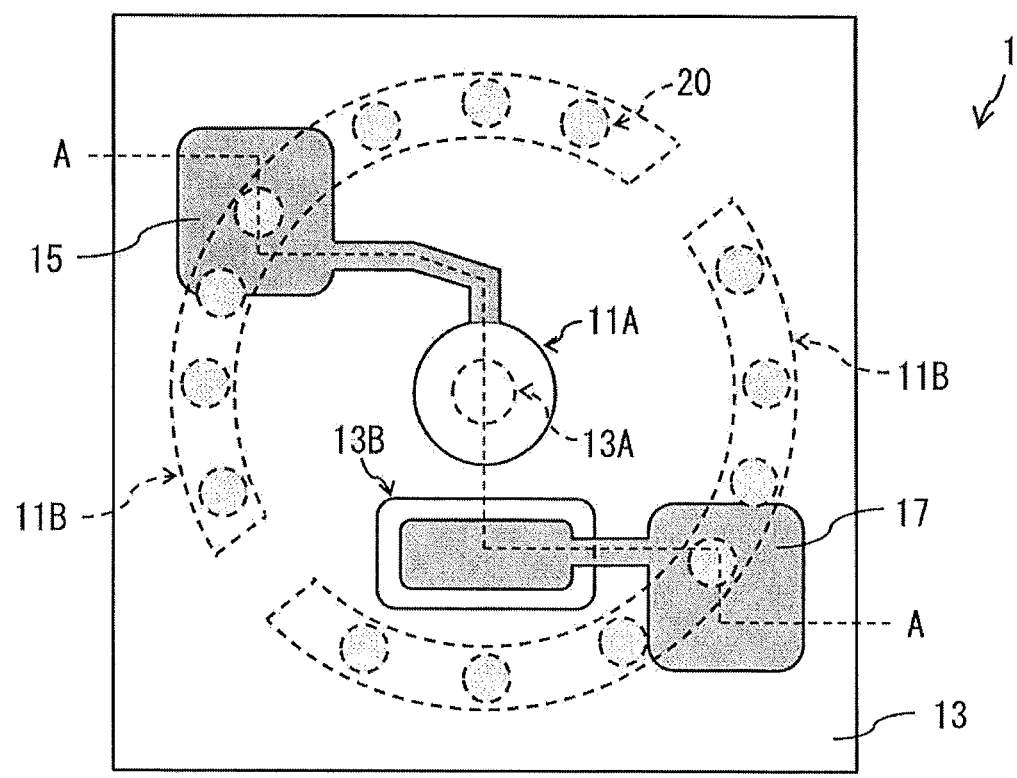

LIGHT-EMITTING DEVICE AND METHOD OF MANUFACTURING LIGHT-EMITTING DEVICE

TECHNICAL FIELD

The present disclosure relates to a light-emitting device and a method of manufacturing a light-emitting device.

BACKGROUND ART

A technology has been disclosed that shapes a reflecting mirror of a surface-emitting laser into a concave curve.

CITATION LIST

Patent Literature

PTL 1: Japanese Unexamined Patent Application Publication No. H3-263023
PTL2: Japanese Unexamined Patent Application Publication No. H9-11791
PTL3: Japanese Unexamined Patent Application Publication (Published Japanese Translation of PCT Application) No. JP2013-541854

SUMMARY OF THE INVENTION

Incidentally, in a case where a reflecting mirror of a surface-emitting laser is made concave-curve-shaped, it is requested to not only dispose an optical axis of the surface-emitting laser at a predetermined position with respect to a wiring substrate, but also protect the reflecting mirror having a concave-curved shape. Therefore, it is desirable to provide a light-emitting device that allows for alignment with respect to the wiring substrate and protection of the reflecting mirror having a concave-curved shape, and a method of manufacturing the light-emitting device.

A light-emitting device according to an embodiment of the present disclosure includes a laminate. The laminate includes an active layer, and a first semiconductor layer and a second semiconductor layer sandwiching the active layer. This light-emitting device further includes a current constriction layer having an opening and a vertical resonator including a first reflecting mirror having a concave-curved shape on the first semiconductor layer side and a second reflecting mirror on the second semiconductor side. The first reflecting mirror and the second reflecting mirror sandwich the laminate and the opening. The first reflecting mirror has a concave-curved shape, curving to the side opposite to the laminate. This light-emitting device further includes an optically transparent substrate between the first reflecting mirror and the laminate. The optically transparent substrate has a first convex portion having a convex-curved shape and one or more second convex portions on a surface on the side opposite to the laminate. The first convex portion is in contact with the first reflecting mirror. The one or more second convex portions are provided around the first convex portion. The one or more second convex portions each have a height greater than or equal to a height of the first convex portion, and an end on the first reflecting mirror side has a convex-curved shape. An end of the second convex portion on the first convex portion side has a convex-curved shape, protruding to the first convex portion side.

In the light-emitting device according to the embodiment of the present disclosure, the first convex portion having a convex-curved shape is provided on the surface of the optically transparent substrate on the side opposite to the laminate. The first convex portion is in contact with the first reflecting mirror. The optically transparent substrate further includes the one or more second convex portions each having the height greater than or equal to the height of the first convex portion around the first convex portion. In the one or more second convex portions, the end on the first reflecting mirror side has a convex-curved shape. As a result, a mounting position of the light-emitting device is determined by a self-alignment function of a convex curve of the second convex portion or a convex curve of a layer formed following the convex curve of the second convex portion. Moreover, the first convex portion is protected by the second convex portion in a manufacturing process or a mounting process of the light-emitting device.

A method of manufacturing a light-emitting device according to an embodiment of the present disclosure includes a resist formation step, a reflow step, and a convex portion formation step. In the resist formation step, first, a light-emitting device substrate including a laminate and a current constriction layer having an opening is prepared on a first main surface of an optically transparent substrate. The laminate includes an active layer, and a first semiconductor layer and a second semiconductor layer sandwiching the active layer. Then, on a second main surface of the optically transparent substrate on a side opposite to the first main surface, a first resist layer is formed at a spot facing the opening and one or more second resist layers are formed around the spot facing the opening. In the reflow step, performing reflow on the first resist layer and the one or more second resist layers shapes a surface of the first resist layer into a convex curve, and shapes at least each of ends of the surfaces of the one or more second resist layers on the first resist layer side into a convex curve. In the convex portion formation step, by performing dry etching using a resist etch-back method with the first resist layer and the one or more second resist layers subjected to the reflow as a mask, on the second main surface of the substrate, a first convex portion having a convex-curved shape is formed at a spot where the first resist layer has been formed, and the second convex portion having a convex-curved shape is formed at a spot where the one or more second resist layers have been formed. In the resist formation step, a width of each of the first resist layer and the one or more second resist layers is set by the reflow and the resist etch-back to cause the height of each of the second convex portions to be greater than or equal to the height of the first convex portion.

In the method of manufacturing the light-emitting device according to the embodiment of the present disclosure, the reflow is performed on the first resist layer and the one or more second resist layers provided on the second main surface of the substrate. This shapes the surface of the first resist layer into a convex curve, and shapes at least each of the ends of the surfaces of the one or more second resist layers on the first resist layer side into a convex curve. Furthermore, the dry etching using the resist etch-back method is performed with the first resist layer and the one or more second resist layers subjected to the reflow as the mask. This forms, on the second main surface of the substrate, the first convex portion having a convex-curved shape at the spot where the first resist layer has been formed, and forms the one or more second convex portions at least each of the ends of which on the first resist layer side has a convex-curved shape, at the spot where the one or more second resist layers have been formed. When the resist is formed, the width of each of the first resist layer and the one or more second resist layers is set by the reflow and the resist etch-back to cause the height of each of the second convex portions to be greater than or equal to the height of the first convex portion. As a result, a mounting position of the light-emitting device is determined by a self-alignment function of a convex curve of the second convex portion or a convex curve of a layer formed following the convex curve of the second convex portion. Moreover, the first convex portion is protected by the second convex portion in a manufacturing process or a mounting process of the light-emitting device.

According to the light-emitting device and the method of manufacturing the light-emitting device according to the respective embodiments of the present disclosure, the self-alignment function of the convex curve of the second convex portion or the convex curve of the layer formed following the convex curve of the second convex portion makes it possible to determine the mounting position of the light-emitting device and to protect the first convex portion by the second convex portion in the manufacturing process or the mounting process of the light-emitting device. Consequently, it is possible to precisely perform alignment of the light-emitting device with respect to the wiring substrate and to protect the reflecting mirror having a concave-curved shape. Note that the effects of the present disclosure are not necessarily limited to the effects described here, but may include any of the effects described herein.

BRIEF DESCRIPTION OF DRAWINGS

FIG. 1 is a diagram illustrating a cross-sectional configuration example of a light-emitting device according to an embodiment of the present disclosure.

FIG. 2 is a diagram illustrating a top configuration example of the light-emitting device of FIG. 1.

FIG. 3 is a diagram illustrating an example of a relation between a lens diameter, a lens height, and a lens radius of curvature.

FIG. 4 is a diagram illustrating an example of a manufacturing procedure of the light-emitting device of FIG. 1.

FIG. 5 is a diagram illustrating an example of a manufacturing process of the light-emitting device of FIG. 1.

FIG. 6 is a diagram illustrating an example of a manufacturing process following FIG. 5.

FIG. 7 is a diagram illustrating an example of a manufacturing process following FIG. 6.

FIG. 8 is a diagram illustrating an example of a manufacturing process following FIG. 7.

FIG. 9 is a diagram illustrating an example of a manufacturing process following FIG. 8.

FIG. 10 is a diagram illustrating an example of a manufacturing process following FIG. 9.

FIG. 11 is a diagram illustrating an example of a manufacturing process following FIG. 10.

FIG. 12 is a diagram illustrating an example of a manufacturing process following FIG. 11.

FIG. 13 is a diagram illustrating an example in which the light-emitting device of FIG. 1 is mounted on a wiring substrate.

FIG. 14 is a diagram illustrating a modification example of the light-emitting device of FIG. 2.

FIG. 15 is a diagram illustrating an example of a manufacturing process of the light-emitting device of FIG. 14.

FIG. 16 is a diagram illustrating a modification example of the light-emitting device of FIG. 2.

FIG. 17 is a diagram illustrating an example of a manufacturing process of the light-emitting device of FIG. 16.

FIG. 18 is a diagram illustrating a modification example of the light-emitting device of FIG. 1.

FIG. 19 is a diagram illustrating a top configuration example of the light-emitting device of FIG. 18.

FIG. 20 is a diagram illustrating a modification example of the light-emitting device of FIG. 2.

FIG. 21 is a diagram illustrating a modification example of the light-emitting device of FIG. 2.

MODES FOR CARRYING OUT THE INVENTION

Hereinafter, an embodiment for practicing the present disclosure is described in detail with reference to the drawings. The following description is a specific example of the present disclosure, but the present disclosure is not limited to the following embodiment. Moreover, the present disclosure does not limit the disposition, dimensions, dimension ratios, and the like of respective components illustrated in the drawings thereto. It is to be noted that description is given in the following order.
1. Embodiment
Example in which Island-shaped Convex Portion Is Formed around Vertical Resonator
2. Modification Examples
Modification Example A: Example in which Vertical Resonator Is Formed at Center Position of Annular Convex Portion
Modification Example B: Example in which Plurality of Portions Resulting from Division of Annular Convex Portion Is Formed around Vertical Resonator
Modification Example C: Example in which Bump is Formed around Vertical Resonator

1. EMBODIMENT

Configuration

Description is given of a light-emitting device 1 according to an embodiment of the present disclosure. FIG. 1 illustrates a cross-sectional configuration example of the light-emitting device 1. FIG. 2 illustrates a top configuration example of the light-emitting device 1.

The light-emitting device 1 is a semiconductor laser of upper surface emission type which is preferably applicable to an application that requests a thin and less power consuming semiconductor laser or an application that requests a thin semiconductor laser large in area, etc. The light-emitting device 1 includes a vertical resonator. The vertical resonator is configured to be oscillated at a predetermined oscillation wavelength $\lambda_0$ by two DBRs (distributed Bragg reflector) facing each other in a normal direction of a substrate 11. The vertical resonator includes two DBR layers sandwiching the substrate 11, a laminate 12, and an opening 13A of a current constriction layer 13. That is, the substrate 11 is a substrate provided inside the vertical resonator and is the substrate provided between one of the DBR layers and the laminate 12. The aforementioned two DBR layers include a DBR layer 18 (first reflecting mirror) on a semiconductor layer 12a side described later and a DBR layer 16 (second reflecting mirror) on a semiconductor layer 12c side described later. The DBR layer 18 is formed in contact with a rear surface of the substrate 11. The laminate 12 includes, for example, an active layer 12b and two semiconductor layers sandwiching the active layer 12b. The aforementioned two semiconductor layers include the semiconductor layer 12a closer to the substrate 11 and the semiconductor layer 12c away from the substrate 11.

The light-emitting device 1 includes, on the substrate 11, for example, the semiconductor layer 12a, the active layer 12b, the semiconductor layer 12c, the current constriction layer 13, an electrode layer 14, electrode pads 15 and 17, and a DBR layer 16 in this order from the substrate 11 side. The light-emitting device 1 further includes, on the rear surface side of the substrate 11, for example, the DBR layer 18 and a metal layer 19 in this order from the substrate 11 side. The laminate 12 may also include, on an outermost surface on the semiconductor layer 12c side, for example, a contact layer for causing the semiconductor layer 12c and the electrode layer 14 to come into ohmic contact with each other. The contact layer may be a layer formed by doping the outermost surface of the semiconductor layer 12c with impurities in high concentration or may be a layer that is formed separately from the semiconductor layer 12c and is in contact with the outermost surface of the semiconductor layer 12c.

The substrate 11 is a crystal growth substrate used at the time of epitaxial crystal growth of the laminate 12. The substrate 11 and the laminate 12 include a gallium-nitride based semiconductor. The substrate 11 is an optically transparent substrate and is a GaN substrate, for example. The laminate 12 includes GaN, AlGaN, AlInN, GaInN, AlGaInN, etc., for example. The semiconductor layer 12a includes GaN, for example. The semiconductor layer 12a includes silicon (Si), etc., for example, as an n-type impurity. That is, the semiconductor layer 12a is an n-type semiconductor layer. The semiconductor layer 12c includes GaN, for example. The semiconductor layer 12c includes magnesium (Mg) or zinc (Zn), etc., for example, as a p-type impurity. That is, the semiconductor layer 12c is a p-type semiconductor layer. The active layer 12b has a quantum well structure, for example. Examples of types of the quantum well structures include a single quantum well structure (QW structure) or a multiple quantum well structure (MQW structure). The quantum well structure has a structure in which well layers and barrier layers are alternately stacked. Examples of combinations of the well layer and the barrier layer include $(In_yGa_{(1-y)}N, GaN)$, $(In_yGa_{(1-y)}N, In_zGa_{(1-z)}N)$ [where y>z], or $(In_yGa_{(1-y)}N, AlGaN)$, etc.

The current constriction layer 13 is a layer for constricting an electric current to be injected into the active layer 12b. The current constriction layer 13 includes an insulating layer having the opening 13A, for example. The insulating layer is formed in contact with the outermost surface of the laminate 12, for example, and includes an inorganic material such as SiO2, for example. It is to be noted that the insulating layer may also include a high-resistance region formed by injection of impurities from the semiconductor layer 12c side of the laminate 12 into the laminate 12. The light-emitting device 1 may include a layer having a function equivalent to the function of the current constriction layer 13, instead of the current constriction layer 13. The light-emitting device 1 may also include a contact layer, for example, between the semiconductor layer 12c and the electrode layer 14. The contact layer has a size equivalent to the size of the opening 13A. Such a contact layer is formed by formation of the contact layer over a whole surface of the semiconductor layer 12c, for example, and then selective etching by RIE (Reactive Ion Etching) method, etc. Provision of such a contact layer also makes it possible to perform current constriction. In addition, the light-emitting device 1 may also have an annular oxidized region. The annular oxidized region is formed by dry etching with a portion of the laminate 12, which serves as a light-emitting unit 10, for example, masked to form the laminate 12 into a cylindrical shape, and then partially oxidizing the cylindrical-shaped laminate 12 from a lateral direction. Provision of such an oxidized region also makes it possible to perform current constriction. The opening 13A has a circular shape, for example. A diameter of the opening 13A is approximately 10 μm, for example.

The electrode layer 14 is in contact with a surface of the laminate 12, which is exposed to a bottom surface of the opening 13A of the current constriction layer 13. The electrode layer 14 includes a transparent electrically-conductive material, for example. Examples of the transparent electrically-conductive materials used for the electrode layer 14 include ITO (Indium Tin Oxide), etc. The electrode pad 15 is to be electrically coupled to an external electrode or circuit, and electrically coupled to the electrode layer 14. The electrode pad 15 is in contact with a portion of the electrode layer 14 not facing the opening 13A, for example. The electrode pad 15 includes, for example, Pd/Ti/Pt/Au, Ti/Pd/Au, Ti/Ni/Au, Ni/Au, or the like.

The electrode pad 17 is to be electrically coupled to an external electrode or circuit, and electrically coupled to the semiconductor layer 12a. The current constriction layer 13 has an opening 13B in a region around the vertical resonator. The laminate 12 has a groove at a position facing the opening 13B, and the semiconductor layer 12a is exposed to a bottom surface of the groove. The electrode pad 17 is in contact with the semiconductor layer 12a via the opening 13B of the current constriction layer 13 and the groove of the laminate 12. The electrode pad 17 is in contact with a portion of the semiconductor layer 12c not facing the opening 13A, for example. The electrode pad 17 includes, for example, Pd/Ti/Pt/Au, Ti/Pd/Au, Ti/Ni/Au, or the like. The electrode pad 17 may also be electrically coupled to the semiconductor layer 12a via another member. For example, in a case where the substrate 11 includes an electrically-conductive material such as the GaN substrate, etc., the electrode pad 17 may be electrically coupled to the semiconductor layer 12a via the substrate 11. In that case, the electrode pad 17 may also be placed on the rear surface (flat surface 11S to be described later) of the substrate 11.

The DBR layers 16 and 18 each include a dielectric multi-layer, for example. The dielectric multi-layer has a structure in which low refractive index layers and high refractive index layers are alternately stacked. Preferably, the low refractive index layer has a thickness of an odd multiple of $\lambda_0/4n_1$ ($n_1$ being a refractive index of the low refractive index layer). Preferably, the high refractive index layer has a thickness of an odd multiple of $\lambda_0/4n_2$ ($n_2$ being a refractive index of the high refractive index layer). Examples of materials of the dielectric multi-layers included in the DBR layers 16 and 18 include $SiO_2$, SiN $Al_2O_3$, $Nb_2O_5$, $Ta_2O_5$, $TiO_2$, AlN, MgO, and $ZrO_2$. In the dielectric multi-layers included in the DBR layers 16 and 18, examples of combinations of the low refractive index layer and the high refractive index layer include $SiO_2/SiN$, $SiO_2/Nb_2O_5$, $SiO_2/ZrO_2$, $SiO_2/AlN$, $SiO_2/Ta_2O_5$, etc. The dielectric multi-layers included in the DBR layers 16 and 18 are formed by a film formation method such as a sputter, CVD, or vapor deposition, for example.

The metal layer 19 is formed in contact with a surface of the DBR layer 18, and, for example, is formed in contact with a whole surface of the DBR layer 18. The metal layer 19 is formed following the surface of the DBR layer 18. The metal layer 19 includes, for example, Pd/Ti/Pt/Au, Ti/Pd/Au, Ti/Ni/Au, or the like. It is to be noted that in a case where an opening is partially provided in the DBR layer 18, the metal layer 19 may also be electrically coupled to the semiconductor layer 12a via the substrate 11 exposed into an opening of the DBR layer 18. In that case, it is possible to cause the metal layer 19 to have a function similar to the electrode pad 17.

The substrate 11 has a convex portion 11A (first convex portion) protruding to the side opposite to the laminate 12, on the rear surface. The convex portion 11A is provided at a position facing the opening 13A. A whole surface of the convex portion 11A has a convex-curved shape, protruding to the side opposite to the laminate 12. It is preferable that a radius of curvature of the surface of the convex portion 11A be larger than the resonator length of the vertical resonator. One reason for this is that in a case where the radius of curvature of the surface of the convex portion 11A is less than or equal to the resonator length of the vertical resonator, optical field confinement becomes excessive, which easily causes optical loss.

The substrate 11 further has a plurality of convex portions 11B (second convex portions) protruding to the side opposite to the laminate 12, on the rear surface. The plurality of convex portions 11B is provided avoiding the position facing the opening 13A. Specifically, the plurality of convex portions 11B is provided around the convex portion 11A. The plurality of convex portions 11B is disposed at point-symmetric positions about the convex portion 11A, for example. Each of the convex portions 11B is island-shaped. Each of the convex portions 11B has a circular shape, an elliptical shape, or a polygonal shape, for example, when viewed from the normal direction of the substrate 11. The convex portion 11B has the height greater than or equal to the height of the convex portion 11A, and at least a surface of an end on the convex portion 11A side has a convex-curved shape. A whole surface of the convex portion 11B may have a convex-curved shape, protruding to the side opposite to the laminate 12. Here, the end of the convex portion 11B on the convex portion 11A side has a convex-curved shape, protruding onto the convex portion 11A side. In addition, the height of the convex portion 11A or 11B refers to a height from the flat surface 11S corresponding to bases of the convex portion 11A and the convex portion 11B on the rear surface of the substrate 11.

As described above, the metal layer 19 is formed following the surface of the DBR layer 18. Consequently, a spot of the metal layer 19 facing the convex portion 11A curves following the surface of the DBR layer 18, and configures a convex portion 10A protruding to the side opposite to the laminate 12. In addition, a spot of the metal layer 19 facing the convex portion 11B also curves following the surface of the DBR layer 18, and configures a convex portion 10B protruding to the side opposite to the laminate 12. The convex portion 10B has the height greater than or equal to the height of the convex portion 10A, and a surface of an end on the convex portion 10A side has a convex-curved shape. A whole surface of the convex portion 10A has a convex-curved shape, for example, protruding to the side opposite to the laminate 12. Here, the height of the convex portion 10A or 10B refers to a height from the flat surface 11S corresponding to bases of the convex portion 11A and the convex portion 11B on the rear surface of the substrate 11.

FIG. 3 illustrates an example of a relation between a lens diameter, a lens height, and a lens radius of curvature. The lens diameter refers to the diameter of the convex portion 11A and the diameter of the convex portion 11B. The lens height refers to the height of the convex portion 11A and the height of the convex portion 11B. The radius of curvature refers to the radius of curvature of the surface of the convex portion 11A and the radius of curvature of the surface of the convex portion 11B.

As described above, the convex portion 11B has a height greater than or equal to the height of the convex portion 11A. The height of the convex portion 11A and the height of the convex portion 11B are formed by etching of the substrate 11 with the reflowed island-shaped resist layer as the mask, as described later. The diameter of the reflowed island-shaped resist layer corresponds to the lens diameter of FIG. 3. That is, changing the diameter of the reflowed island-shaped resist layer may make it possible to adjust the heights or the radii of curvature of the convex portion 11A and the convex portion 11B.

A design is assumed that makes the diameter of the island-shaped resist layer to be used in formation of the convex portion 11B smaller than the diameter of the island-shaped resist layer to be used in formation of the convex portion 11A. For example, it is assumed that the diameter of the island-shaped resist layer to be used in the formation of the convex portion 11A is 80 µm, and the diameter of the island-shaped resist layer to be used in the formation of the convex portion 11B is greater than or equal to 30 µm and less than or equal to 70 µm. At this time, according to FIG. 3, it is possible to form the convex portion 11B higher than the convex portion 11A. Moreover, then, the diameter of the convex portion 11A is 80 µm, the diameter of the convex portion 11B is greater than or equal to 30 µm and less than or equal to 70 µm, and the radius of curvature of the surface of the convex portion 11B is smaller than the radius of curvature of the convex portion 11A.

Then, a design is assumed that makes the diameter of the island-shaped resist layer to be used in formation of the convex portion 11B larger than the diameter of the island-shaped resist layer to be used in formation of the convex portion 11A. For example, it is assumed that the diameter of the island-shaped resist layer to be used in the formation of the convex portion 11A is 30 µm, and the diameter of the island-shaped resist layer to be used in the formation of the convex portion 11B is greater than or equal to 40 µm and less than or equal to 60 µm. At this time, according to FIG. 3, it is possible to form the convex portion 11B higher than the convex portion 11A. Moreover, then, the diameter of the convex portion 11A is 30 µm, the diameter of the convex portion 11B is greater than or equal to 40 µm and less than or equal to 60 µm, and the radius of curvature of the surface of the convex portion 11B is larger than the radius of curvature of the convex portion 11A.

The DBR layer 18 is formed following at least the surface of the convex portion 11A, and functions as a reflecting mirror having a concave-curved shape for the vertical resonator. The DBR layer 18 has a concave-curved shape, curving to the side opposite to the laminate 12. The DBR layer 18 may be formed following a whole surface including the surfaces of the convex portions 11A and 11B. FIG. 1 illustrates an example of a case where the DBR layer 18 is formed following a whole surface including the surfaces of the convex portions 11A and 11B. In contrast, the DBR layer 16 is formed following a surface of the electrode layer 14, and formed in contact with the surface of the electrode layer 14. With respect to the DBR layer 16, a portion of the DBR layer 16 facing the opening 13A is substantially flat. It is preferable that the active layer 12b be disposed closer to the DBR layer 16 and the current constriction layer 13 than to the DBR layer 18. One reason for this is that this intensifies the optical field confinement in the active layer 12b, thereby making laser oscillation easier. It is also preferable that the shortest distance $D_{CI}$ from an area center of gravity point of the current constriction layer 13 to an inner edge of the opening 13A satisfy the following expression. One reason for this is that a region where light reflected by the DBR layer 18 is consequently collected is included in a region where the active layer 12b has a gain due to current injection, which facilitates light to be guided and emitted from a carrier and makes the laser oscillation easier. It is to be noted that derivation of the following expression is disclosed in, for example, H. Kogelnik and T. Li, "Laser Beams and Resonators", Applied Optics/Vol. 5, No. 10/October 1966. In addition, $\omega_0$ is also referred to as a beam waist radius.

$$D_{CI} \geq \omega_0/2$$

however, $$\omega_0^2 \equiv (\lambda_0/\pi)\{L_{OR}(R_{DBR}-L_{OR})\}^{1/2}$$

where
$\lambda_0$: Oscillation wavelength
$L_{OR}$: Resonator length
$R_{DBR}$: Radius of curvature of the DBR layer 18 (=radius of curvature of the surface of the convex portion 11A)

Manufacturing Method

Next, description is given of a method of manufacturing the light-emitting device 1 according to the present embodiment. FIG. 4 illustrates an example of a manufacturing procedure of the light-emitting device 1. FIGS. 5 to 13 each illustrate an example of a manufacturing process of the light-emitting device 1. First, the laminate 12 is formed on the surface (first main surface) of the substrate 11 by an epitaxial crystal growth method such as an MOCVD (Metal Organic Chemical Vapor Deposition: organometallic vapor-phase growth) method, for example (FIG. 5). Then, the current constriction layer 13 having the opening 13A is formed on the surface of the laminate 12 by, for example, a CVD (chemical vapor deposition) method, a sputter method, a vapor deposition method, or ion implantation, etc. (FIG. 6). Furthermore, after the electrode layer 14 is formed to cover the opening 13A by, for example, the sputter method or the vapor deposition method, etc., the DBR layer 16 is formed on the electrode layer 14 by, for example, the CVD method, the sputter method, or the vapor deposition method, etc. (FIG. 6). To mold the electrode layer 14 or the DBR layer 16, an etching method such as a wet etching method or a dry etching method, or a pattern formation method such as a lift-off method is used, for example.

Subsequently, the electrode pad 15 is formed to be in contact with the end of the electrode layer 14, by the vapor deposition method, for example (FIG. 7). Then, by the wet etching method or the dry etching method, etc., for example, the opening 13B is formed on the current constriction layer 13, and a groove is formed in the laminate 12 until the semiconductor layer 12a is exposed (FIG. 7). Subsequently, by the vapor deposition method, etc., for example, the electrode pad 17 is formed (FIG. 7). At this time, the electrode pad 17 is formed to be in contact with the semiconductor layer 12a via the opening 13B formed in the current constriction layer 13 and the groove formed in the laminate 12.

Subsequently, a support substrate 22 is pasted to a surface including the electrode pads 15 and 17 via an adhesion layer 21. Then, the rear surface (second main surface) of the substrate 11 on the side opposite to the surface (first main surface) is mirror-finished by, for example, etching such as CMP (Chemical Mechanical Polishing) or polishing with a grinder (FIG. 8, step S101). Preferably, the substrate 11 has a thickness of 100 μm or less. In addition, concavity and convexity level of the rear surface of the substrate 11 is preferably Rms=10 nm or less, more preferably 1 nm or less. Then, a resist pattern is formed on the polished rear surface of the substrate 11. As a result, a resist layer 23A (first resist layer) is formed in the island shape at a spot facing the opening 13A and two or more resist layers 23B (second resist layers) are formed in the island shape around the spot facing the opening 13A (FIG. 9, step S102).

At this time, when viewed from a normal direction of the support substrate 22, the resist layers 23A and 23B each have, for example, a circular shape, an elliptical shape, or a polygonal shape. Width R1 and width R2 of the resist layer 23A and the resist layer 23B differ from each other. The width R1 and the width R2 of the resist layer 23A and the resist layer 23B are set by the reflow and the resist etch-back, to be descried later, to cause each of the convex portions 11B to have a height greater than or equal to the height of the convex portion 11A. Specifically, the width R1 and the width R2 of the resist layer 23A and the resist layer 23B are set on the basis of the relation described in FIG. 3 to cause the height of the convex portion 11B to be greater than or equal to the height of the convex portion 11A.

A design is assumed that makes the diameter of the island-shaped resist layer 23B to be used in formation of the convex portion 11B smaller than the diameter of the island-shaped resist layer 23A to be used in formation of the convex portion 11A. For example, it is assumed that the width R1 of the resist layer 23A is 80 μm, and the width R2 of the resist layer 23B is greater than or equal to 30 μm and less than or equal to 70 μm. At this time, according to FIG. 3, it is possible to form the convex portion 11B formed by the island-shaped resist layer 23B to be higher than the convex portion 11A formed by the island-shaped resist layer 23A. Moreover, then, the diameter of the convex portion 11A is 80 μm, the diameter of the convex portion 11B is greater than or equal to 30 μm and less than or equal to 70 μm, and the radius of curvature of the surface of the convex portion 11B is smaller than the radius of curvature of the convex portion 11A.

Then, a design is assumed that makes the diameter of the island-shaped resist layer 23B to be used in formation of the convex portion 11B larger than the diameter of the island-shaped resist layer 23A to be used in formation of the convex portion 11A. For example, it is assumed that the width R1 of the resist layer 23A is 30 μm, and the width R2 of the resist layer 23B is greater than or equal to 40 μm and less than or equal to 60 μm. At this time, according to FIG. 3, it is possible to form the convex portion 11B formed by the island-shaped resist layer 23B to be higher than the convex portion 11A formed by the island-shaped resist layer 23A. Moreover, then, the diameter of the convex portion 11A is 30 μm, the diameter of the convex portion 11B is greater than or equal to 40 μm and less than or equal to 60 μm, and the radius of curvature of the surface of the convex portion 11B is larger than the radius of curvature of the convex portion 11A.

Subsequently, the reflow is performed on the resist layer 23A and the plurality of resist layers 23B (FIG. 10, step S103). This shapes the surface of the resist layer 23A into a convex curve, and shapes at least each of the ends of the surfaces of the plurality of resist layers 23B on the resist layer 23A side into a convex curve. For example, this shapes each of the whole surfaces of the resist layers 23A and 23B into a convex curve. At this time, the height of the resist layer 23B is greater than or equal to the height of the resist layer 23A. Although conditions of the reflow vary depending on the material or the thickness of the resist layers 23A and 23B, etc., for example, temperatures from approximately 150° C. to 200° C. and a duration of approximately 5 to 15 minutes are set.

Subsequently, dry etching is performed on the substrate 11 with the resist layers 23A and 23B, the surfaces of which each have a convex-curved shape, as a mask (FIG. 11, step S104). That is, the dry etching using the resist etch-back method is performed on the substrate 11 with the resist layers 23A and 23B subjected to the reflow as the mask. At this time, it is preferable that the etching speed of the substrate 11 and the etching speed of the resist layers 23A and 23B be as equal as possible. The use of such a resist etch-back method makes it possible to form, on the rear surface of the substrate 11, the convex portions 11A and 11B each having a convex-curved shape similar to a surface shape of the resist layers 23A and 23B. Specifically, it is possible to form the convex portion 11A having a convex-curved shape at the spot where the resist layer 23A has been formed and to form, and form, at the spot where each of the resist layers 23B has been formed, the convex portion 11B at least an end of which on the convex portion 11A side has a surface having a convex-curved shape. As a result, the height of each of the convex portions 11B is greater than or equal to the height of the convex portion 11A.

Next, the DBR layer 18 is formed on the whole surface including the surfaces of the convex portions 11A and 11B by, for example, the CVD method, the sputter method, or the vapor deposition method, etc. (FIG. 12, step S105). Subsequently, the metal layer 19 is formed on the whole surface of the DBR layer 18 by, for example, the sputter method or the vapor deposition method, etc. (FIG. 12, step S105). At this time, in the metal layer 19, the spot (convex portion 10B) facing the convex portion 11B has a height greater than or equal to the height of the spot (convex portion 10A) facing the convex portion 11A. In addition, in the metal layer 19, a surface of an end of the convex portion 10B on the convex portion 10A side has a convex-curved shape. In addition, in the metal layer 19, the whole surface of the convex portion 10B has a convex-curved shape. In this manner, the two DBR layers 16 and 18 (vertical resonators) sandwiching the substrate 11 (convex portion 11A, specifically), the laminate 12, and the opening 13A of the current constriction layer 13 are formed, and the light-emitting unit 10 including the vertical resonators is formed. After that, the adhesion layer 21 and the support substrate 22 are peeled off from the surface including the electrode pads 15 and 17, and the substrate 11 is cut into a predetermined size. The light-emitting device 1 is manufactured in this manner.

It is to be noted that the method of manufacturing the light-emitting device 1 is not limited to the aforementioned method. For example, after the rear surface of the substrate 11 is mirror-finished and the support substrate 22 is then peeled off, the convex portions 11A and 11B, the DBR layer 18, the metal layer 19, or the like, may be formed in the absence of the support substrate 22.

Mounting

FIG. 13 illustrates an example in which the light-emitting device 1 is mounted on a wiring substrate 30. The wiring substrate 30 includes a plurality of electrode pads 31 on a surface. An in-plane layout of the plurality of electrode pads 31 is common to an in-plane layout of the plurality of convex portions 11B (or the convex portions 10B), for example. The light-emitting device 1 is mounted on the wiring substrate 30 with the plurality of the convex portions 10B directed to the wiring substrate 30 side. The plurality of the convex portions 10B is fixed to the plurality of electrode pads 31 via a solder bump 32. When mounted, the light-emitting device 1 is positioned by the self-alignment function of the convex curve of each of the convex portions 10B in contact with the solder bump 32 in a molten state. This makes it possible to precisely dispose an optical axis AX of the light-emitting device 1 at a predetermined position with respect to the wiring substrate 30. In addition, each of the convex portions 10B has a height greater than or equal to the height of the convex portion 10A, thus allowing each of the convex portions 11B to play a role to protect the convex portion 11A, for example, in the process of mounting the light-emitting device 1 on the wiring substrate 30.

Operation

When a predetermined voltage is applied between the electrode pad 15 electrically coupled to the semiconductor layer 12c and the electrode pad 17 electrically coupled to the semiconductor layer 12a, electric currents are injected into the active layer 12b through the opening 13A in the light-emitting device 1 configured in this manner, thus resulting in emission of light by a recombination of an electron and a hole. This light is reflected by a pair of the DBR layer 16 and the DBR layer 18 and laser oscillation is generated at a predetermined oscillation wavelength $\lambda_0$. Then, light leaking from the DBR layer 16 is outputted to the outside as beam-shaped laser light. At this time, in a case where the laminate 12 includes a nitride-based semiconductor material, for example, blue laser light is emitted from the DBR layer 16. It is to be noted that in a case where an opening is partially provided in the DBR layer 18, it is possible to cause the metal layer 19 to have a function similar to the function of the electrode pad 17 by electrically coupling the metal layer 19 to the semiconductor layer 12a via the substrate 11 exposed into the opening of the DBR layer 18.

Effects

Next, description is given of effects attained by the light-emitting device 1 according to the present embodiment.

In a case where a reflecting mirror of a surface-emitting laser is shaped into a concave curve, it is requested to not only dispose an optical axis of the surface-emitting laser at a predetermined position with respect to a wiring substrate, but also protect the reflecting mirror having a concave-curved shape. For example, in the invention described in PTL 1 above, an opening is formed by etching of a portion of a substrate immediately under a light-emitting device, and lens processing is performed on a bottom surface of the opening. Although this allows for protection of the lens, to form an opening in the substrate, it is still necessary that the substrate be bored to a depth of several tens to several hundreds of μm. Therefore, the method of PTL1 has a high level of technical difficulty and is not suitable for mass production. Moreover, etching damage remains on a bottom surface of the opening, and thus, the bottom surface of the opening is not suitable for lens formation. Furthermore, it is not known whether or not it is possible to use a spot of the substrate corresponding to an edge of the opening for positioning when a light-emitting device is mounted.

In contrast, in the present embodiment, on the surface of the substrate 11 on the side opposite to the laminate 12 is provided the convex portion 11A having a convex-curved shape, in contact with the DBR layer 18, and faces the opening 13A. In the substrate 11, the plurality of the convex portions 11B each having a height greater than or equal to the height of the convex portion 11A is further provided around the convex portion 11A. In each of the convex portions 11B, the surface of the end on the convex portion 11A side has a convex-curved shape. As a result, the mounting position of the light-emitting device 1 is determined by the self-alignment function of the convex curve of the metal layer 19 (convex portion 10B) formed following the convex curve of the convex portion 11B. Moreover, the convex portion 11A is protected by the convex portion 11B in a manufacturing process or a mounting process of the light-emitting device 1. Consequently, it is possible to precisely align the light-emitting device 1 with the wiring substrate 30 and to protect the DBR layer 18.

In addition, in the present embodiment, the convex portion 11A and each of the convex portions 10B are island-shaped. Consequently, performing the resist etch-back utilizing the relation, for example, illustrated in FIG. 3 allows each of the convex portions 11B to be higher than or equal to the convex portion 11A and also makes it possible to collectively form the convex portion 11A and the respective convex portions 11B. Consequently, it is possible to precisely align the light-emitting device 1 with the wiring substrate 30 without requesting an additional manufacturing procedure and to protect the DBR layer 18. Moreover, simultaneous formation of the convex portion 11 and the respective convex portions 10B is possible, and it is thus possible to avoid aggravated roughness due to damage from unnecessary etching. This makes it possible to suppress diffraction loss due to aggravated roughness and also to suppress a crack, etc. due to stress concentration.

In addition, in the present embodiment, the substrate 11 is a GaN substrate. Consequently, performing the resist etch-back utilizing the relation, for example, illustrated in FIG. 3 on the GaN substrate allows each of the convex portions 11B to be higher than or equal to the convex portion 11A and also makes it possible to collectively form the convex portion 11A and the respective convex portions 11B. Consequently, it is possible to precisely align the light-emitting device 1 with the wiring substrate 30 without requesting an additional manufacturing procedure and to protect the DBR layer 18. Moreover, simultaneous formation of the convex portion 11 and the respective convex portions 10B is possible, and it is thus possible to avoid aggravated roughness due to damage from unnecessary etching. This makes it possible to suppress diffraction loss due to aggravated roughness and also to suppress a crack, etc. due to stress concentration.

In addition, in the present embodiment, the reflow is performed on the island-shaped resist layer 23A and the plurality of island-shaped resist layers 23B provided on the rear surface of the substrate 11 in the manufacturing process. This shapes the surface of the resist layer 23A into a convex curve, and shapes at least each of the ends of the surfaces of the plurality of resist layers 23B on the resist layer 23A side into a convex curve. Furthermore, the dry etching using the resist etch-back method is performed with the resist layer 23A and the plurality of resist layers 23B subjected to the reflow as the mask. With this, on the rear surface of the substrate 11, the convex portion 11A having a convex-curved shape is formed at the spot where the resist layer 23A has been formed, and the plurality of convex portions 11B at least ends of which on the resist layer 23A side each have a convex-curved shape is formed at the spot where the plurality of resist layers 23B has been formed. The width R1 and the width R2 of the resist layer 23A and each of the plurality of resist layers 23B are set by the reflow and the resist etch-back to cause each of the convex portions 11B to have a height greater than or equal to the height of the convex portion 11A. As a result, the mounting position of the light-emitting device 1 is determined by the self-alignment function of the convex curve of the metal layer 19 formed following the convex curve of the convex portion 11B. Moreover, the convex portion 11A is protected by the convex portion 11B in a manufacturing process or a mounting process of the light-emitting device 1. Accordingly, it is possible to precisely align the light-emitting device 1 with the wiring substrate 30 without requesting an additional manufacturing procedure and to protect the DBR layer 18. Moreover, simultaneous formation of the convex portion 11 and the respective convex portions 10B is possible, and it is thus possible to avoid aggravated roughness due to damage from unnecessary etching. This makes it possible to suppress diffraction loss due to aggravated roughness and also to suppress a crack, etc. due to stress concentration.

In addition, in the present embodiment, in the manufacturing process, the one resist layer 23A is formed and the two or more resist layers 23B are formed. Furthermore, the resist layer 23A and the respective resist layers 23B are formed in the island shape. With this, simply setting the width R1 and the width R2 of the resist layer 23A and the plurality of resist layers 23B to a predetermined value makes it possible to make the height of each of the convex portions 11B greater than or equal to the height of the convex portion 11A. Accordingly, it is possible to precisely align the light-emitting device 1 with the wiring substrate 30 without requesting an additional manufacturing procedure and to protect the DBR layer 18. Moreover, simultaneous formation of the convex portion 11 and the respective convex portions 10B is possible, and it is thus possible to avoid aggravated roughness due to damage from unnecessary etching. This makes it possible to suppress diffraction loss due to aggravated roughness and also to suppress a crack, etc. due to stress concentration.

2. MODIFICATION EXAMPLES

Next, description is given of modification examples of the light-emitting device 1 according to the aforementioned embodiment.

Modification Example A

FIG. 14 illustrates a modification example of the light-emitting device 1. In the modification example, the only one convex portion 11B is provided. In the modification example, the convex portion 11B has an annular shape. The convex portion 11B has, for example, a toric shape, an elliptical ring shape, or a polygonal ring shape. The convex portion1 11A is disposed in the opening of the convex portion 11B. The convex portions 11B are provided avoiding the position facing the opening 13A. Specifically, the convex portions 11B are provided around the convex portion 11A. The convex portions 11B are disposed at point-symmetric positions about the convex portion 11A, for example. The convex portion 11B has the height greater than or equal to the height of the convex portion 11A, and at least a surface of an end (end on the inner perimeter side) on the convex portion 11A side has a convex-curved shape. A whole surface of the convex portion 11B may have a convex-curved shape, protruding to the side opposite to the laminate 12 in the width direction of the convex portion 11B.

The height of the convex portion 11B is formed by etching of the substrate 11 with the reflowed annular resist layer as the mask, as described later. The width of the reflowed annular resist layer corresponds to the lens diameter of FIG. 3. That is, changing the width of the reflowed annular resist layer may make it possible to adjust the height or the radius of curvature of the convex portion 11B in the width direction.

A design is assumed that makes the width of the annular resist layer to be used in formation of the convex portion 11B smaller than the diameter of the island-shaped resist layer to be used in formation of the convex portion 11A. For example, it is assumed that the diameter of the island-shaped resist layer to be used in the formation of the convex portion 11A is 80 µm, and the width of the annular resist layer to be used in the formation of the convex portion 11B is greater than or equal to 30 µm and less than or equal to 70 µm. At this time, according to FIG. 3, it is possible to form the convex portion 11B higher than the convex portion 11A. Moreover, then, the diameter of the convex portion 11A is 80 µm, the width of the convex portion 11B is greater than or equal to 30 µm and less than or equal to 70 µm, and the radius of curvature of the surface of the convex portion 11B is smaller than the radius of curvature of the convex portion 11A.

Then, a design is assumed that makes the width of the annular resist layer to be used in formation of the convex portion 11B larger than the diameter of the island-shaped resist layer to be used in formation of the convex portion 11A. For example, it is assumed that the diameter of the island-shaped resist layer to be used in the formation of the convex portion 11A is 30 µm, and the width of the annular resist layer to be used in the formation of the convex portion 11B is greater than or equal to 40 µm and less than or equal to 60 µm. At this time, according to FIG. 3, it is possible to form the convex portion 11B higher than the convex portion 11A. Moreover, then, the diameter of the convex portion 11A is 30 µm, the width of the convex portion 11B is greater than or equal to 40 µm and less than or equal to 60 µm, and the radius of curvature of the surface of the convex portion 11B is larger than the radius of curvature of the convex portion 11A.

The convex portions 11A and 11B are formed, for example, as described below. First, as illustrated in FIG. 8, the rear surface of the substrate 11 is mirror-finished. Then, a resist pattern is formed on the polished rear surface of the substrate 11. As a result, a resist layer 23A (first resist layer) is formed in the island shape at a spot facing the opening 13A and the resist layers 23B (second resist layers) are formed in the annular shape around the spot facing the opening 13A (FIG. 15).

The width R1 and the width R2 of the resist layer 23A and the resist layer 23B are set by the reflow and the resist etch-back to cause each of the convex portions 11B to have a height greater than or equal to the height of the convex portion 11A. Specifically, the width R1 and the width R2 of the resist layer 23A and the resist layer 23B are set on the basis of the relation described in FIG. 3 to cause the height of the convex portion 11B to be greater than or equal to the height of the convex portion 11A.

A design is assumed that makes the width of the annular resist layer 23B to be used in formation of the convex portion 11B smaller than the diameter of the island-shaped resist layer 23A to be used in formation of the convex portion 11A. For example, it is assumed that the width R1 of the resist layer 23A is 80 µm, and the width R2 of the resist layer 23B is greater than or equal to 30 µm and less than or equal to 70 µm. At this time, according to FIG. 3, it is possible to form the convex portion 11B formed by the annular resist layer 23B to be higher than the convex portion 11A formed by the island-shaped resist layer 23A. Moreover, then, the diameter of the convex portion 11A is 80 µm, the width of the convex portion 11B is greater than or equal to 30 µm and less than or equal to 70 µm, and the radius of curvature of the surface of the convex portion 11B is smaller than the radius of curvature of the convex portion 11A.

Then, a design is assumed that makes the width of the annular resist layer 23B to be used in formation of the convex portion 11B larger than the diameter of the island-shaped resist layer 23A to be used in formation of the convex portion 11A. For example, it is assumed that the width R1 of the resist layer 23A is 30 µm, and the width R2 of the resist layer 23B is greater than or equal to 40 µm and less than or equal to 60 µm. At this time, according to FIG. 3, it is possible to form the convex portion 11B formed by the island-shaped resist layer 23B to be higher than the convex portion 11A formed by the island-shaped resist layer 23A. Moreover, then, the diameter of the convex portion 11A is 30 µm, the width of the convex portion 11B is greater than or equal to 40 µm and less than or equal to 60 µm, and the radius of curvature of the surface of the convex portion 11B is larger than the radius of curvature of the convex portion 11A.

Subsequently, the reflow is performed on the resist layers 23A and 23B. This shapes the surface of the resist layer 23A into a convex curve, and shapes at least each of the ends of the surfaces of the resist layers 23B on the resist layer 23A side into a convex curve. For example, the whole surface of the resist layer 23A is shaped into a convex curve, and the surface of the resist layer 23B in the width direction is shaped into a convex curve. At this time, the height of the resist layer 23B is greater than or equal to the height of the resist layer 23A.

Subsequently, dry etching is performed on the substrate 11 with the resist layers 23A and 23B, the surfaces of which each have a convex-curved shape, as a mask. That is, the dry etching using the resist etch-back method is performed on the substrate 11 with the resist layers 23A and 23B subjected to the reflow as the mask. At this time, it is preferable that the etching speed of the substrate 11 and the etching speed of the resist layers 23A and 23B be as equal as possible. The use of such a resist etch-back method makes it possible to form, on the rear surface of the substrate 11, the convex portions 11A and 11B each having a convex-curved shape similar to a surface shape of the resist layers 23A and 23B. Specifically, it is possible to form the convex portion 11A having a convex-curved shape at the spot where the resist layer 23A has been formed and to form, and form, at the spot where each of the resist layers 23B has been formed, the convex portion 11B at least an end (end on the inner perimeter side) of which on the convex portion 11A side has a surface having a convex-curved shape. As a result, the height of each of the convex portions 11B is greater than or equal to the height of the convex portion 11A.

Next, description is given of effects of the light-emitting device 1 according to the modification example.

In the modification example, on the surface of the substrate 11 on the side opposite to the laminate 12 is provided the convex portion 11A having a convex-curved shape, in contact with the DBR layer 18, and faces the opening 13A. In the substrate 11, the annular convex portions 11B each having a height greater than or equal to the height of the convex portion 11A are further provided around the convex portion 11A. In the annular convex portions 11B, at least the surface of the end (end on the inner perimeter side) on the convex portion 11A side has a convex-curved shape. As a result, the mounting position of the light-emitting device 1 is determined by the self-alignment function of the convex curve of the metal layer 19 (convex portion 10B) formed following the convex curve of the convex portion 11B. Moreover, the convex portion 11A is protected by the convex portion 11B in a manufacturing process or a mounting process of the light-emitting device 1. Consequently, it is possible to precisely align the light-emitting device 1 with the wiring substrate 30 and to protect the DBR layer 18.

In addition, in the modification example, the convex portion 11A is island-shaped, and the convex portion 10B has an annular shape. Consequently, performing the resist etch-back utilizing the relation, for example, illustrated in FIG. 3 allows each of the convex portions 11B to be higher than or equal to the convex portion 11A and also makes it possible to collectively form the convex portion 11A and the respective convex portions 11B. Consequently, it is possible to precisely align the light-emitting device 1 with the wiring substrate 30 without requesting an additional manufacturing procedure and to protect the DBR layer 18. Moreover, simultaneous formation of the convex portion 11 and the convex portions 10B is possible, and it is thus possible to avoid aggravated roughness due to damage from unnecessary etching. This makes it possible to suppress diffraction loss due to aggravated roughness and also to suppress a crack, etc. due to stress concentration.

In addition, in the modification example, the reflow is performed on the island-shaped resist layer 23A and the annular resist layers 23B provided on the rear surface of the substrate 11 in the manufacturing process. This shapes the surface of the resist layer 23A into a convex curve, and shapes at least each of the surfaces of the ends (ends on the inner perimeter side) of the surfaces of the resist layers 23B on the resist layer 23A side into a convex curve. Furthermore, the dry etching using the resist etch-back method is performed with the resist layer 23A and the resist layers 23B subjected to the reflow as the mask. With this, on the rear surface of the substrate 11, the convex portion 11A having a convex-curved shape is formed at the spot where the resist layer 23A has been formed, and the convex portions 11B at least ends (ends on the inner perimeter side) of which on the resist layer 23A side each have a surface having a convex-curved shape are formed at the spot where the resist layers 23B have been formed. The width R1 and the width R2 of the resist layer 23A and each of the resist layers 23B are set by the reflow and the resist etch-back to cause each of the convex portions 11B to have a height greater than or equal to the height of the convex portion 11A. As a result, the mounting position of the light-emitting device 1 is determined by the self-alignment function of the convex curve of the metal layer 19 formed following the convex curve of the convex portion 11B. Moreover, the convex portion 11A is protected by the convex portion 11B in a manufacturing process or a mounting process of the light-emitting device 1. Accordingly, it is possible to precisely align the light-emitting device 1 with the wiring substrate 30 without requesting an additional manufacturing procedure and to protect the DBR layer 18. Moreover, simultaneous formation of the convex portion 11 and the convex portions 10B is possible, and it is thus possible to avoid aggravated roughness due to damage from unnecessary etching. This makes it possible to suppress diffraction loss due to aggravated roughness and also to suppress a crack, etc. due to stress concentration.

In addition, in the modification example, in the manufacturing process, the one resist layer 23A is formed and the one resist layer 23B is formed. Furthermore, the resist layer 23A is formed in the island shape and the resist layer 23B is formed in the annular shape. With this, simply setting the width R1 and the width R2 of the resist layer 23A and each of the resist layers 23B to a predetermined value makes it possible to make the height of each of the convex portions 11B greater than or equal to the height of the convex portion 11A. Accordingly, it is possible to precisely align the light-emitting device 1 with the wiring substrate 30 without requesting an additional manufacturing procedure and to protect the DBR layer 18. Moreover, simultaneous formation of the convex portion 11 and the convex portions 10B is possible, and it is thus possible to avoid aggravated roughness due to damage from unnecessary etching. This makes it possible to suppress diffraction loss due to aggravated roughness and also to suppress a crack, etc. due to stress concentration.

Modification Example B

FIG. 16 illustrates a modification example of the light-emitting device 1. In the modification example, the two or more convex portions 11B are provided. In the modification example, the plurality of the convex portions 11B has a shape and a layout in which the annular convex portion is divided into a plurality of portions. Each of the convex portions 11B has the shape of a straight bar or the shape of a curved bar. The plurality of convex portions 11B is provided avoiding the position facing the opening 13A. Specifically, the plurality of convex portions 11B is provided around the convex portion 11A. The plurality of convex portions 11B is disposed at point-symmetric positions about the convex portion 11A, for example. Each convex portion 11B has the height greater than or equal to the height of the convex portion 11A, and at least a surface of an end on the convex portion 11A side has a convex-curved shape. A whole surface of each convex portion 11B may have a convex-curved shape, protruding to the side opposite to the laminate 12 in the width direction of the convex portion 11B.

The height of the convex portion 11B is formed by etching of the substrate 11 with the reflowed bar-shaped resist layer as the mask, as described later. The width of the reflowed bar-shaped resist layer corresponds to the lens diameter of FIG. 3. That is, changing the width of the reflowed bar-shaped resist layer may make it possible to adjust the height or the radius of curvature of the convex portion 11B in the width direction.

A design is assumed that makes the width of the bar-shaped resist layer to be used in formation of the convex portion 11B smaller than the diameter of the island-shaped resist layer to be used in formation of the convex portion 11A. For example, it is assumed that the diameter of the island-shaped resist layer to be used in the formation of the convex portion 11A is 80 µm, and the width of the bar-shaped resist layer to be used in the formation of the convex portion 11B is greater than or equal to 30 µm and less than or equal to 70 µm. At this time, according to FIG. 3, it is possible to form the convex portion 11B higher than the convex portion 11A. Moreover, then, the diameter of the convex portion 11A is 80 µm, the width of the convex portion 11B is greater than or equal to 30 µm and less than or equal to 70 µm, and the radius of curvature of the surface of the convex portion 11B is smaller than the radius of curvature of the convex portion 11A.

Then, a design is assumed that makes the width of the bar-shaped resist layer to be used in formation of the convex portion 11B larger than the diameter of the island-shaped resist layer to be used in formation of the convex portion 11A. For example, it is assumed that the diameter of the island-shaped resist layer to be used in the formation of the convex portion 11A is 30 μm, and the width of the bar-shaped resist layer to be used in the formation of the convex portion 11B is greater than or equal to 40 μm and less than or equal to 60 μm. At this time, according to FIG. 3, it is possible to form the convex portion 11B higher than the convex portion 11A. Moreover, then, the diameter of the convex portion 11A is 30 μm, the width of the convex portion 11B is greater than or equal to 40 μm and less than or equal to 60 μm, and the radius of curvature of the surface of the convex portion 11B is larger than the radius of curvature of the convex portion 11A.

The convex portions 11A and 11B are formed, for example, as described below. First, as illustrated in FIG. 8, the rear surface of the substrate 11 is mirror-finished. Then, a resist pattern is formed on the polished rear surface of the substrate 11. As a result, the resist layer 23A (first resist layer) is formed in the island shape at the spot facing the opening 13A and each of the resist layers 23B (second resist layers) is formed around the spot facing the opening 13A to have the shape and layout in which the annular convex portion is divided into the plurality of portions (FIG. 17).

The width R1 and the width R2 of the resist layer 23A and the resist layer 23B are set by the reflow and the resist etch-back to cause each of the convex portions 11B to have a height greater than or equal to the height of the convex portion 11A. Specifically, the width R1 and the width R2 of the resist layer 23A and the resist layer 23B are set on the basis of the relation described in FIG. 3 to cause the height of the convex portion 11B to be greater than or equal to the height of the convex portion 11A.

A design is assumed that makes the width of the bar-shaped resist layer 23B to be used in formation of the convex portion 11B smaller than the diameter of the island-shaped resist layer 23A to be used in formation of the convex portion 11A. For example, it is assumed that the width R1 of the resist layer 23A is 80 μm, and the width R2 of the resist layer 23B is greater than or equal to 30 μm and less than or equal to 70 μm. At this time, according to FIG. 3, it is possible to form the convex portion 11B formed by the bar-shaped resist layer 23B to be higher than the convex portion 11A formed by the island-shaped resist layer 23A. Moreover, then, the diameter of the convex portion 11A is 80 μm, the width of the convex portion 11B is greater than or equal to 30 μm and less than or equal to 70 μm, and the radius of curvature of the surface of the convex portion 11B is smaller than the radius of curvature of the convex portion 11A.

Then, a design is assumed that makes the width of the bar-shaped resist layer 23B to be used in formation of the convex portion 11B larger than the diameter of the island-shaped resist layer 23A to be used in formation of the convex portion 11A. For example, it is assumed that the width R1 of the resist layer 23A is 30 μm, and the width R2 of the resist layer 23B is greater than or equal to 40 μm and less than or equal to 60 μm. At this time, according to FIG. 3, it is possible to form the convex portion 11B formed by the bar-shaped resist layer 23B to be higher than the convex portion 11A formed by the island-shaped resist layer 23A. Moreover, then, the diameter of the convex portion 11A is 30 μm, the width of the convex portion 11B is greater than or equal to 40 μm and less than or equal to 60 μm, and the radius of curvature of the surface of the convex portion 11B is larger than the radius of curvature of the convex portion 11A.

Subsequently, the reflow is performed on the resist layers 23A and 23B. This shapes the surface of the resist layer 23A into a convex curve, and shapes at least each of the ends of the surfaces of the resist layers 23B on the resist layer 23A side into a convex curve. For example, the whole surface of the resist layer 23A is shaped into a convex curve, and the surface of the resist layer 23B in the width direction is shaped into a convex curve. At this time, the height of the resist layer 23B is greater than or equal to the height of the resist layer 23A.

Subsequently, dry etching is performed on the substrate 11 with the resist layers 23A and 23B, the surfaces of which each have a convex-curved shape, as a mask. That is, the dry etching using the resist etch-back method is performed on the substrate 11 with the resist layers 23A and 23B subjected to the reflow as the mask. At this time, it is preferable that the etching speed of the substrate 11 and the etching speed of the resist layers 23A and 23B be as equal as possible. The use of such a resist etch-back method makes it possible to form, on the rear surface of the substrate 11, the convex portions 11A and 11B each having a convex-curved shape similar to a surface shape of the resist layers 23A and 23B. Specifically, it is possible to form the convex portion 11A having a convex-curved shape at the spot where the resist layer 23A has been formed and to form, and form, at the spot where each of the resist layers 23B has been formed, the convex portion 11B at least an end (end on the inner perimeter side) of which on the convex portion 11A side has a surface having a convex-curved shape. As a result, the height of each of the convex portions 11B is greater than or equal to the height of the convex portion 11A.

Next, description is given of effects of the light-emitting device 1 according to the modification example.

In the modification example, on the surface of the substrate 11 on the side opposite to the laminate 12 is provided the convex portion 11A having a convex-curved shape, in contact with the DBR layer 18, and faces the opening 13A. In the substrate 11, the plurality of bar-shaped convex portions 11B each having a height greater than or equal to the height of the convex portion 11A is further provided around the convex portion 11A. In each bar-shaped convex portions 11B, at least the surface of the end on the convex portion 11A side has a convex-curved shape. As a result, the mounting position of the light-emitting device 1 is determined by the self-alignment function of the convex curve of the metal layer 19 (convex portion 10B) formed following the convex curve of the convex portion 11B. Moreover, the convex portion 11A is protected by the convex portion 11B in a manufacturing process or a mounting process of the light-emitting device 1. Consequently, it is possible to precisely align the light-emitting device 1 with the wiring substrate 30 and to protect the DBR layer 18.

In addition, in the modification example, the convex portion 11A is island-shaped, and the convex portion 10B is bar-shaped. Consequently, performing the resist etch-back utilizing the relation, for example, illustrated in FIG. 3 allows each of the convex portions 11B to be higher than or equal to the convex portion 11A and also makes it possible to collectively form the convex portion 11A and the respective convex portions 11B. In addition, a gap is present between the two convex portions 10B adjacent to each other, thus making it possible to control a position into which a polishing solution is poured by using the gap thereof, when the convex portion 11A, for example, is polished by CMP, etc. Therefore, it is possible to distort the shape of the convex portion 11A or make an adjustment such as approximating the shape distortion of the convex portion 11A to axial symmetry without requesting an additional manufacturing procedure. Moreover, it is also possible to protect the DBR layer 18 by the convex portion 11A and the convex portions 11B. Moreover, simultaneous formation of the convex portion 11 and the convex portions 10B is possible, and it is thus possible to avoid aggravated roughness due to damage from unnecessary etching. This makes it possible to suppress diffraction loss due to aggravated roughness and also to suppress a crack, etc. due to stress concentration.

In addition, in the modification example, the reflow is performed on the island-shaped resist layer 23A and the bar-shaped resist layers 23B provided on the rear surface of the substrate 11 in the manufacturing process. This shapes the surface of the resist layer 23A into a convex curve, and shapes at least each of the surfaces of the ends of the surfaces of the resist layers 23B on the resist layer 23A side into a convex curve. Furthermore, the dry etching using the resist etch-back method is performed with the resist layer 23A and the resist layers 23B subjected to the reflow as the mask. With this, on the rear surface of the substrate 11, the convex portion 11A having a convex-curved shape is formed at the spot where the resist layer 23A has been formed, and the convex portions 11B at least ends of which on the resist layer 23A side each have a surface having a convex-curved shape are formed at the spot where the resist layers 23B have been formed. The width R1 and the width R2 of the resist layer 23A and each of the resist layers 23B are set by the reflow and the resist etch-back to cause each of the convex portions 11B to have a height greater than or equal to the height of the convex portion 11A. As a result, the mounting position of the light-emitting device 1 is determined by the self-alignment function of the convex curve of the metal layer 19 formed following the convex curve of the convex portion 11B. Moreover, the convex portion 11A is protected by the convex portion 11B in a manufacturing process or a mounting process of the light-emitting device 1. Accordingly, it is possible to precisely align the light-emitting device 1 with the wiring substrate 30 without requesting an additional manufacturing procedure and to protect the DBR layer 18. Moreover, simultaneous formation of the convex portion 11 and the convex portions 10B is possible, and it is thus possible to avoid aggravated roughness due to damage from unnecessary etching. This makes it possible to suppress diffraction loss due to aggravated roughness and also to suppress a crack, etc. due to stress concentration.

In addition, in the modification example, in the manufacturing process, the one resist layer 23A is formed and the two or more resist layers 23B are formed. Furthermore, the resist layer 23A is formed in the island shape and the resist layers 23B are formed in the bar shape. With this, simply setting the width R1 and the width R2 of the resist layer 23A and each of the resist layers 23B to a predetermined value makes it possible to make the height of each of the convex portions 11B greater than or equal to the height of the convex portion 11A. Accordingly, it is possible to precisely align the light-emitting device 1 with the wiring substrate 30 without requesting an additional manufacturing procedure and to protect the DBR layer 18. Moreover, simultaneous formation of the convex portion 11 and the convex portions 10B is possible, and it is thus possible to avoid aggravated roughness due to damage from unnecessary etching. This makes it possible to suppress diffraction loss due to aggravated roughness and also to suppress a crack, etc. due to stress concentration.

Modification Example C

FIG. 18 illustrates a modification example of the light-emitting device 1 of FIG. 1. FIG. 19 illustrates a top configuration example of the light-emitting device 1 of FIG. 18. FIG. 20 illustrates a modification example of the light-emitting device 1 of FIG. 2. FIG. 21 illustrates a modification example of the light-emitting device 1 of FIG. 2.

The light-emitting device 1 according to the modification example corresponds to the light-emitting device 1 according to the aforementioned embodiment in which a bump 20 (bump metal) is further provided at a position facing the convex portions 11B and 11C. The bump 20 is provided in a through-hole that penetrates through the DBR layer 18 and the metal layer 19, for example. The bump 20 has a height greater than or equal to the height of the convex portion 10A. Here, the height of the bump 20 refers to a height from the flat surface 11S corresponding to a base of the convex portion 11A on the rear surface of the substrate 11. Even in such a configuration, the bump 20 attains the function similar to the functions of the convex portions 10B and 10C according to the aforementioned embodiment. Consequently, it is possible to precisely align the light-emitting device 1 with the wiring substrate 30 and to protect the DBR layer 18.

The present disclosure has been described above with reference to the embodiment and the modification examples thereof. The present disclosure is not, however, limited to the embodiment or the like described above. A variety of modifications may be made. Note that the effects described herein are merely illustrative. The effects of the present disclosure are not limited to the effects described herein. The present disclosure may have effects other than the effects described herein.

For example, the present disclosure may also be configured as follows.

(1)

A light-emitting device including:

a laminate including an active layer, and a first semiconductor layer and a second semiconductor layer sandwiching the active layer;

a current constriction layer having an opening;

a first reflecting mirror on the first semiconductor layer side and a second reflecting mirror on the second semiconductor layer side, the first reflecting mirror and the second reflecting mirror sandwiching the laminate and the opening, the first reflecting mirror having a concave-curved shape; and an optically transparent substrate provided between the first reflecting mirror and the laminate, the optically transparent substrate including, on a surface on a side opposite to the laminate, a first convex portion in contact with the first reflecting mirror, the first convex portion having a convex-curved shape, and one or more second convex portions provided around the first convex portion, the one or more second convex portions each having a height greater than or equal to a height of the first convex portion, and each having an end on the first convex portion side shaped into a convex curve.

(2)

The light-emitting device according to (1), in which the second reflecting mirror is formed following a surface including a surface of the first convex portion and a surface of the second convex portion.

(3)
The light-emitting device according to (2), further including a metal layer formed following a surface of the second reflecting mirror.

(4)
The light-emitting device according to any one of (1) to (3), in which
the optically transparent substrate includes a plurality of the second convex portions, and
each of the second convex portions is island-shaped.

(5)
The light-emitting device according to any one of (1) to (3), in which
the optically transparent substrate includes the one second convex portion, and
the second convex portion has a toric shape.

(6)
The light-emitting device according to any one of (1) to (3), in which
the optically transparent substrate includes a plurality of the second convex portions, and
a plurality of the second convex portions has a shape and a layout in which an annular convex portion is divided into a plurality of portions.

(7)
The light-emitting device according to any one of (1) to (6), further including bump metal formed at a position facing the second convex portion.

(8)
The light-emitting device according to any one of (1) to (7), in which the optically transparent substrate is a GaN substrate.

(9)
A method of manufacturing a light-emitting device, the method including:
a resist formation step of forming, in a light-emitting device substrate including, on a first main surface of an optically transparent substrate, a laminate including an active layer, and a first semiconductor layer and a second semiconductor layer sandwiching the active layer, and a current constriction layer having an opening, a first resist layer at a spot facing the opening, and forming one or more second resist layers around the spot facing the opening on a second main surface of the optically transparent substrate on a side opposite to the first main surface;
a reflow step of performing reflow on the first resist layer and the one or second resist layers, thereby shaping a surface of the first resist layer into a convex curve and shaping at least each of ends of the surfaces of the one or more second resist layers on the first resist layer side into a convex curve; and
a convex portion formation step of forming, on the second main surface of the substrate, a first convex portion having a convex-curved shape at a spot where the first resist layer has been formed, and forming a second convex portion at least an end of which on the first resist layer side has a convex-curved shape at a spot where the one or more second resist layers have been formed, by performing dry etching using a resist etch-back method, with the first resist layer and the one or more second resist layers subjected to the reflow as a mask,
a width of each of the first resist layer and the one or more second resist layers being set, in the resist formation step, by the reflow and the resist etch-back to cause each of the second convex portions to have a height greater than or equal to a height of the first convex portion.

(10)
The method of manufacturing the light-emitting device according to (9), in which, in the resist formation step, the one first resist layer is formed, the two or more second resist layers are formed, and the first resist layer and each of the second resist layers are further formed in an island shape.

(11)
The method of manufacturing the light-emitting device according to (9), in which, in the resist formation step, the one first resist layer is formed, the one second resist layer is formed, the first resist layer is further formed in an island shape, and the second resist layer is formed in a toric shape.

(12)
The method of manufacturing the light-emitting device according to (9), in which, in the resist formation step, the one first resist layer is formed, the two or more second resist layers are formed, the first resist layer is further formed in an island shape, and each of the second resist layers is formed to have a shape and a layout that an annular convex portion is divided into a plurality of portions.

This application claims the priority on the basis of Japanese Patent Application No. 2017-107830 filed with Japan Patent Office on May 31, 2017, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. A light-emitting device comprising:
a laminate including an active layer, and a first semiconductor layer and a second semiconductor layer sandwiching the active layer;
a current constriction layer having an opening, wherein the current constriction layer is provided above the second semiconductor layer and the active layer in a thickness direction;
a first reflecting mirror on the first semiconductor layer side and a second reflecting mirror on the second semiconductor layer side, the first reflecting mirror and the second reflecting mirror sandwiching the laminate and the opening, the first reflecting mirror having a concave-curved shape; and
an optically transparent substrate provided between the first reflecting mirror and the laminate,
the optically transparent substrate including, on a surface on a side opposite to the laminate,
a first convex portion in contact with the first reflecting mirror, the first convex portion having a convex-curved shape, and
one or more second convex portions provided around the first convex portion, the one or more second convex portions each having a height greater than or equal to a height of the first convex portion, and each having an end on the first convex portion side shaped into a convex curve, wherein the one or more second convex portions have a semicircle shape in a cross section view.

2. The light-emitting device according to claim 1, wherein the first reflecting mirror is formed following a surface including a surface of the first convex portion and a surface of the second convex portion.

3. The light-emitting device according to claim 2, further comprising a metal layer formed following a surface of the first reflecting mirror.

4. The light-emitting device according to claim 1, wherein
the optically transparent substrate includes a plurality of the second convex portions, and
each of the second convex portions is island-shaped.

5. The light-emitting device according to claim 1, wherein
the optically transparent substrate includes the one second convex portion, and
the second convex portion has a toric shape.

6. The light-emitting device according to claim 1, wherein
the optically transparent substrate includes a plurality of the second convex portions, and
a plurality of the second convex portions has a shape and a layout in which an annular convex portion is divided into a plurality of portions.

7. The light-emitting device according to claim 2, further comprising bump metal formed at a position facing the second convex portion.

8. The light-emitting device according to claim 1, wherein the optically transparent substrate is a GaN substrate.

9. A method of manufacturing a light-emitting device, the method comprising:
   a resist formation step of forming, in a light-emitting device substrate including, on a first main surface of an optically transparent substrate, a laminate including an active layer, and a first semiconductor layer and a second semiconductor layer sandwiching the active layer, and a current constriction layer having an opening, a first resist layer at a spot facing the opening, and forming one or more second resist layers around the spot facing the opening on a second main surface of the optically transparent substrate on a side opposite to the first main surface, wherein the current constriction layer is provided above the second semiconductor layer and the active layer in a thickness direction;
   a reflow step of performing reflow on the first resist layer and the one or second resist layers, thereby shaping a surface of the first resist layer into a convex curve and shaping at least each of ends of the surfaces of the one or more second resist layers on the first resist layer side into a convex curve; and
   a convex portion formation step of forming, on the second main surface of the substrate, a first convex portion having a convex-curved shape at a spot where the first resist layer has been formed, and forming a second convex portion at least an end of which on the first resist layer side has a convex-curved shape at a spot where the one or more second resist layers have been formed, by performing dry etching using a resist etch-back method, with the first resist layer and the one or more second resist layers subjected to the reflow as a mask, and
   a first reflecting mirror formation step of forming a first reflecting mirror on the first convex portion,
   wherein a width of each of the first resist layer and the one or more second resist layers being set, in the resist formation step, by the reflow and the resist etch-back to cause each of the second convex portions to have a height greater than or equal to a height of the first convex portion, and wherein the second convex portions each have a semicircle shape in a cross section view.

10. The method of manufacturing the light-emitting device according to claim 9, wherein, in the resist formation step, the one first resist layer is formed, the one or more second resist layers are formed, and the first resist layer and each of the second resist layers are further formed in an island shape.

11. The method of manufacturing the light-emitting device according to claim 9, wherein, in the resist formation step, the one first resist layer is formed, the one or more second resist layers are formed, the first resist layer is further formed in an island shape, and the one or more second resist layers are formed in a toric shape.

12. The method of manufacturing the light-emitting device according to claim 9, wherein, in the resist formation step, the one first resist layer is formed, the one or more second resist layers are formed, the first resist layer is further formed in an island shape, and each of the second resist layers is formed to have a shape and a layout that an annular convex portion is divided into a plurality of portions.

13. The light-emitting device according to claim 1, wherein the second reflecting mirror includes a dielectric multi-layer.

* * * * *